(12) United States Patent (10) Patent No.: US 12,634,588 B2

Shimizu (45) Date of Patent: May 19, 2026

(54) MONITORING METHOD IN SUBSTRATE PROCESSING APPARATUS AND SUBSTRATE PROCESSING APPARATUS

(71) Applicant: SCREEN Holdings Co., Ltd., Kyoto (JP)

(72) Inventor: Shinji Shimizu, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 468 days.

(21) Appl. No.: 18/169,520

(22) Filed: Feb. 15, 2023

(65) Prior Publication Data

US 2023/0283909 A1 Sep. 7, 2023

(30) Foreign Application Priority Data

Mar. 2, 2022 (JP) ................................. 2022-031478

(51) Int. Cl.
H04N 23/74 (2023.01)
H04N 23/667 (2023.01)
(Continued)

(52) U.S. Cl.
CPC ........... H04N 23/74 (2023.01); H04N 23/667 (2023.01); H10P 72/0604 (2026.01); H10P 72/0616 (2026.01); H10P 74/203 (2026.01)

(58) Field of Classification Search
CPC ................. H04N 23/74; H04N 23/667; H01L 21/67253; H01L 21/67288; H01L 22/12;
(Continued)

(56) References Cited

U.S. PATENT DOCUMENTS 4,391,034 A * 7/1983 Stuby ................... G03F 7/70433
438/945
5,305,224 A 4/1994 Hishida et al.
(Continued)

FOREIGN PATENT DOCUMENTS

JP H05-182026 A 7/1993
JP 2009-238454 A 10/2009
(Continued)

OTHER PUBLICATIONS

First Office Action and Search Report dated Mar. 18, 2024 in corresponding Taiwanese Patent Application No. 112104737 and a machine generated translation thereof based on a Japanese translation of the Office Action.
(Continued)

*Primary Examiner* — Binh X Tran
*Assistant Examiner* — Christopher Remavege
(74) *Attorney, Agent, or Firm* — OSTROLENK FABER LLP

(57) ABSTRACT

A monitoring method includes a setting-up processing step, a capturing step, and a monitoring step. The setting-up processing step includes a step of generating, with a camera, a plurality of preliminarily captured images corresponding to a plurality of irradiation modes, a step of identifying a non-existent region indicating at least one of a shadow and a reflected image of an object included in a preliminarily captured image in a first irradiation mode, based on a difference between the plurality of preliminarily captured images, and a step of storing non-existent-region data in a storage. In the capturing step after the setting-up processing step, the camera generates a monitoring captured image while the capture region is irradiated with the illumination light in the first irradiation mode. In the monitoring step, the monitoring target object is monitored based on a region of
(Continued)

PRELIMINARILY CAPTURING STEP

S111
DETERMINE IRRADIATION MODE
(POSITION, WAVELENGTH,
OR QUANTITY OF LIGHT)

S112
CAPTURE CAPTURE REGION WITH
CAMERA WHILE ILLUMINATION IRRADIATES
CAPTURE REGION WITH ILLUMINATION LIGHT
IN DETERMINED IRRADIATION MODE

S113
PREDETERMINED NO
NUMBER?

YES

RETURN the monitoring captured image except the non-existent region.

11 Claims, 12 Drawing Sheets

(51) Int. Cl.
*H10P 72/00* (2026.01)
*H10P 74/20* (2026.01)

(58) Field of Classification Search
CPC ............... H01L 22/10; H01L 21/67023; H01L 21/67259; H01L 21/67051; H01L 21/6708; H01L 21/6715; H01L 21/68728; G06T 7/001; G06T 2207/30148; H10P 72/0604; H10P 72/0616; H10P 74/203; H10P 72/0404; H10P 74/20; H10P 72/0414; H10P 72/0424; H10P 72/0448; H10P 72/0606; H10P 72/7608
See application file for complete search history.

(56) References Cited

U.S. PATENT DOCUMENTS

| | | | | | |
|---|---|---|---|---|---|
| 7,486,878 | B2 * | 2/2009 | Chen | ..................... | H01L 21/681 |
| | | | | | 396/419 |
| 9,769,392 | B1 * | 9/2017 | Colburn | ................. | G03B 15/05 |
| 2010/0133257 | A1 * | 6/2010 | Sorabji | .............. | H10P 72/0606 |
| | | | | | 219/447.1 |

| | | | | | |
|---|---|---|---|---|---|
| 2011/0054659 | A1 * | 3/2011 | Carlson | ............. | H01L 21/67253 |
| | | | | | 700/109 |
| 2014/0174351 | A1 * | 6/2014 | Aikawa | ................... | C23C 16/52 |
| | | | | | 118/713 |
| 2015/0147827 | A1 * | 5/2015 | deVilliers | ............... | G03F 7/168 |
| | | | | | 438/795 |
| 2016/0172257 | A1 | 6/2016 | Kondo | | |
| 2017/0004987 | A1 * | 1/2017 | Fairbairn | .............. | H01L 21/681 |
| 2018/0323085 | A1 * | 11/2018 | Sano | ................. | H01L 21/67051 |
| 2019/0139206 | A1 * | 5/2019 | Derakhshani | .......... | H04N 23/74 |
| 2021/0074594 | A1 * | 3/2021 | Park | .................. | H01J 37/32935 |
| 2022/0005736 | A1 | 1/2022 | Naohara et al. | | |
| 2022/0084892 | A1 * | 3/2022 | Meyer | ............... | G01N 21/8806 |

FOREIGN PATENT DOCUMENTS

| | | | |
|---|---|---|---|
| JP | 2013-228264 | A | 11/2013 |
| JP | 2015-173148 | A | 10/2015 |
| JP | 2016-115738 | A | 6/2016 |
| JP | 2019-169057 | A | 10/2019 |
| JP | 2020-061403 | A | 4/2020 |
| KR | 10-2019-0014615 | A | 2/2019 |
| TW | I714256 | B | 12/2020 |

OTHER PUBLICATIONS

Request for the Submission of an Opinion dated Oct. 10, 2024 in corresponding Korean Patent Application No. 10-2023-0025843 and an English machine language translation obtained from the Global Dossier.

Notice of Decision to Grant dated Sep. 9, 2025 in corresponding Japanese Patent Application No. 2022-031478.

* cited by examiner

F I G. 1
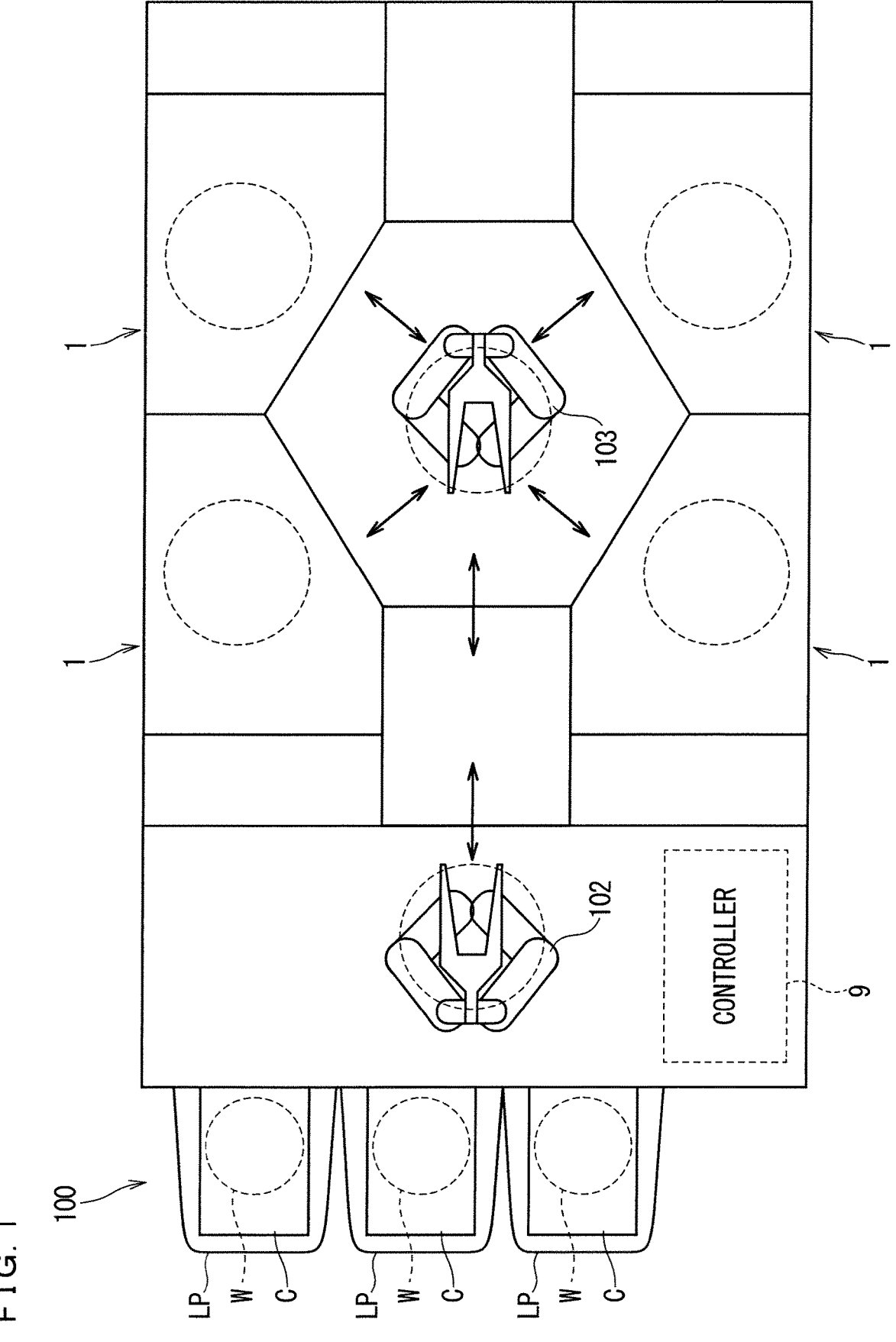

F I G. 4
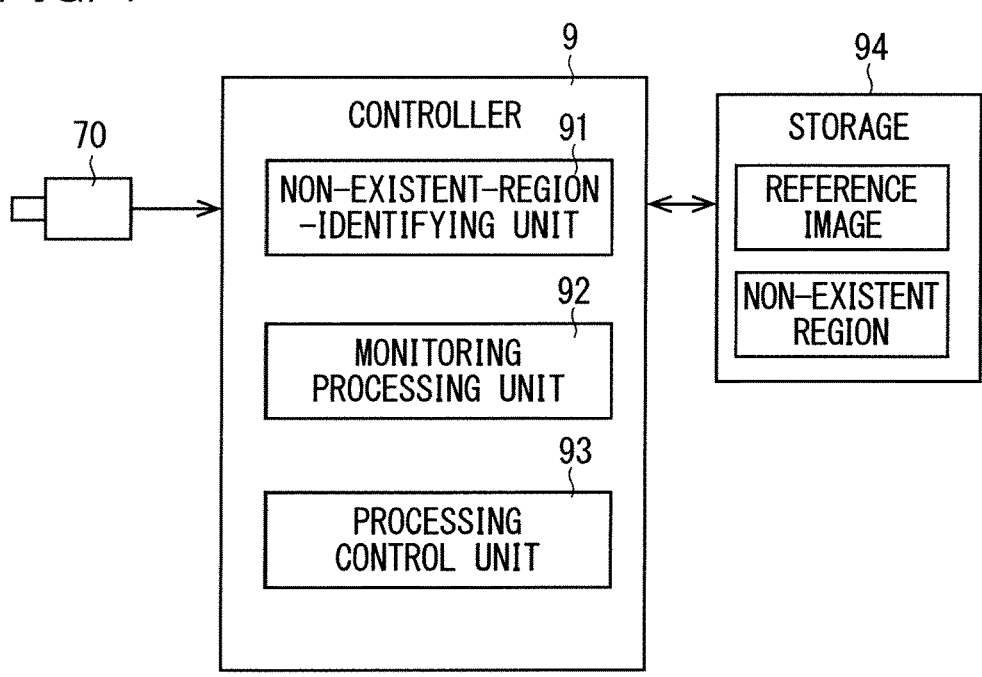
F I G. 5
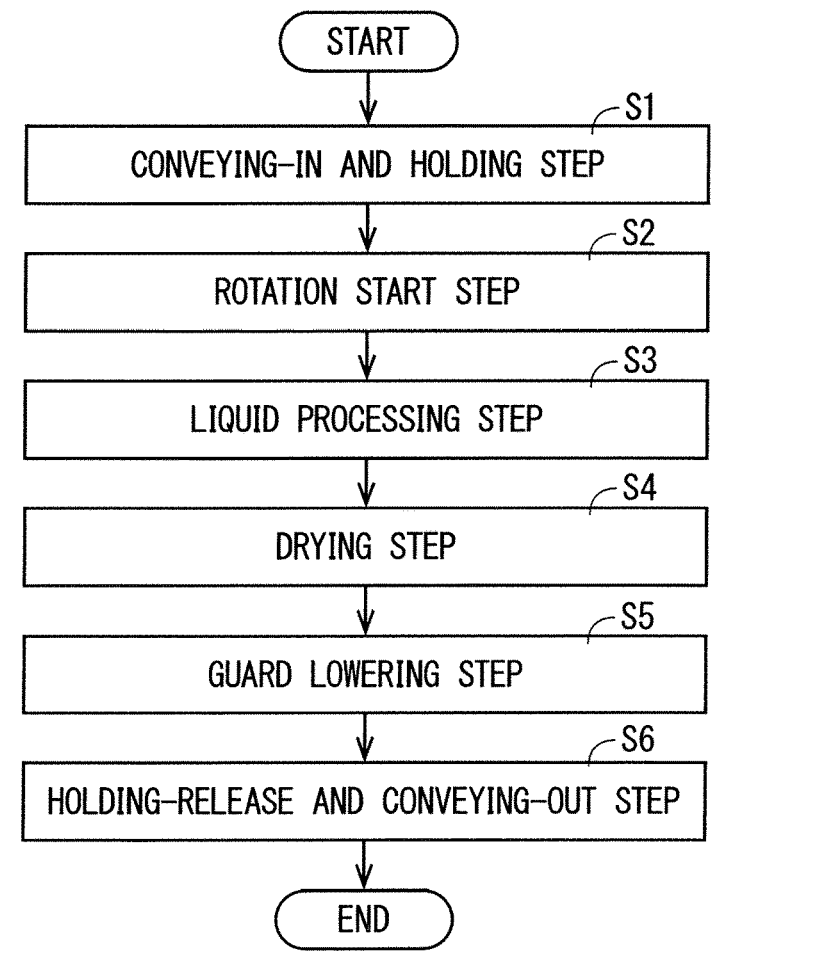

F I G. 1 4

26

26

30

26

W

IR3

40(43)

R3

MONITORING METHOD IN SUBSTRATE PROCESSING APPARATUS AND SUBSTRATE PROCESSING APPARATUS

BACKGROUND OF THE INVENTION

Field of the Invention

The present disclosure relates to a monitoring method in a substrate processing apparatus and a substrate processing apparatus.

Description of the Background Art

In a process of manufacturing a semiconductor device or the like, various processing liquids, such as pure water, a photoresist liquid, and an etching liquid, are conventionally supplied to a substrate to perform various substrate processing, such as cleaning processing and resist coating processing. As an apparatus for performing the substrate processing using these processing liquids, widely used is a substrate processing apparatus in which while a substrate holder rotates a substrate in a horizontal orientation, a processing liquid is discharged from a nozzle to the surface of the substrate. The nozzle discharges the processing liquid at, for example, a processing position facing a central portion of the upper surface of the substrate in a vertical direction. The processing liquid that has landed on the central portion of the substrate receives the centrifugal force accompanying the rotation of the substrate, and spreads over the surface of the substrate. At this time, the processing liquid acts on the surface of the substrate, so that the substrate is processed.

In such a substrate processing apparatus, whether or not the position of the nozzle is appropriate is monitored. For example, in Japanese Patent Application Laid-Open No. 2015-173148, capturing means, such as a camera, is provided to monitor the position of the nozzle.

In Japanese Patent Application Laid-Open No. 2015-173148, the camera is provided above a substrate holder. The camera captures a capture region including a substrate held by the substrate holder and a nozzle to generate a captured image. In Japanese Patent Application Laid-Open No. 2015-173148, a reference image including the nozzle is preset, and the position of the nozzle is detected by matching processing between the reference image and a captured image captured by the camera.

In order to appropriately process the substrate, it is desirable to monitor not only the nozzle but also more monitoring target objects.

For example, the substrate holder includes a spin base disk-shaped and provided under the substrate, and a plurality of chuck pins erected on the upper surface of the spin base and aligning in a circumferential direction along the periphery of the substrate. The plurality of chuck pins moves to holding positions where the plurality of chuck pins is in contact with the periphery of the substrate, so that the substrate holder can hold the substrate. The plurality of chuck pins moves to open positions away from the periphery of the substrate, so that the holding of the substrate is released.

If a malfunction occurs and the chuck pins cannot move to the holding positions, the substrate holder cannot normally hold the substrate.

Accordingly, it is conceivable that the camera captures a capture region including the chuck pins to generate captured image data, and an image processing unit monitors the positions of the chuck pins on the basis of the captured image data.

However, the captured image data may include not only such a monitoring target object but also a non-existent object that is a shadow or a reflected image of an object. The reflected image is, for example, an image that appears on the surface of the substrate. When such a non-existent object is adjacent to or overlaps a monitoring target object in the captured image data, there is a problem that monitoring precision is decreased.

SUMMARY OF THE INVENTION

The present disclosure is directed to a monitoring method in a substrate processing apparatus and a substrate processing apparatus.

An aspect of the present disclosure is a monitoring method in a substrate processing apparatus, the method including: a setting-up processing step including a preliminarily capturing step of sequentially capturing, with a camera, a capture region including a monitoring target object in a chamber containing a substrate holder holding a substrate while the capture region is sequentially irradiated with illumination light in a plurality of irradiation modes, to generate a plurality of pieces of preliminarily captured image data corresponding to the plurality of irradiation modes, a preliminarily identifying step of identifying a non-existent region indicating at least one of a shadow and a reflected image of an object included in preliminarily captured image data at a time of irradiation with the illumination light in a first irradiation mode, based on a difference between the plurality of pieces of preliminarily captured image data, and a storage step of storing, in a storage, non-existent-region data indicating a position and a shape of the non-existent region; a capturing step, after the setting-up processing step, of capturing the capture region with the camera while the capture region is irradiated with the illumination light in the first irradiation mode, to generate monitoring-captured-image data; and a monitoring step of monitoring the monitoring target object based on a region of the monitoring-captured-image data except the non-existent region indicated by the non-existent-region data stored in the storage.

The influence of the non-existent region can be avoided to monitor the monitoring target object with higher precision.

The storage may store reference image data including the monitoring target object that is normal, and in the monitoring step, the monitoring target object may be monitored based on comparison between removed image data obtained by deleting the non-existent region from the monitoring-captured-image data, and removed reference image data obtained by deleting a region same as the non-existent region from the reference image data.

Since the non-existent region is deleted from the monitoring-captured-image data and the reference image data, the influence of the non-existent region can be avoided in the comparison between the removed image data and the removed reference image data. Therefore, the influence of the non-existent region can be avoided to monitor the monitoring target object with higher precision.

An aspect of the present disclosure is a monitoring method in a substrate processing apparatus, the method including: a setting-up processing step including a preliminarily capturing step of sequentially capturing, with a camera, a capture region including a monitoring target object in a chamber containing a substrate holder holding a substrate while the capture region is sequentially irradiated with illumination light in a plurality of irradiation modes, to generate a plurality of pieces of preliminarily captured image data corresponding to the plurality of irradiation modes, a preliminarily identifying step of identifying a non-existent region indicating at least one of a shadow and a reflected image of an object included in preliminarily captured image data at a time of irradiation with the illumination light in a first irradiation mode, based on a difference between the plurality of pieces of preliminarily captured image data, and a storage step of storing, in a storage, non-existent-region data indicating a position and a shape of the non-existent region; a capturing step, after the setting-up processing step, of capturing the capture region while the capture region is irradiated with the illumination light in the first irradiation mode, to generate monitoring-captured-image data; and a monitoring step of monitoring the monitoring target object based on comparison between the monitoring-captured-image data and reference image data including the monitoring target object that is normal and not including a region same as the non-existent region indicated by the non-existent-region data stored in the storage.

The influence of the non-existent region can be avoided to monitor the monitoring target object with higher precision.

The plurality of irradiation modes may include modes in which the capture region is irradiated with the illumination light from different irradiation positions.

Since the positions and shapes of the non-existent region are different from each other in the plurality of preliminarily captured images, the non-existent region is easily identified.

The plurality of irradiation modes may include modes in which the capture region is irradiated with the illumination light having different wavelength spectra.

It is not necessary to provide a plurality of illuminators, or it is not necessary to move an illuminator.

The plurality of irradiation modes may include modes in which the capture region is irradiated with the illumination light having different quantities of light.

It is not necessary to provide a plurality of illuminators, or it is not necessary to move an illuminator. Furthermore, an inexpensive light source can be used for an illuminator.

In the preliminarily identifying step, the non-existent region may be identified based on a difference between the preliminarily captured image data corresponding to the first irradiation mode and average image data of the plurality of pieces of preliminarily captured image data.

The non-existent region can be identified with higher precision.

An aspect of the present disclosure is a substrate processing apparatus including: a chamber; a substrate holder that is provided in the chamber and holds a substrate; an illuminator that irradiates a capture region including a monitoring target object in the chamber with illumination light; a camera that captures the capture region to generate captured image data; a storage that stores non-existent-region data indicating a position and a shape of a non-existent region indicating at least one of a shadow and a reflected image of an object included in the captured image data; and a controller that monitors the monitoring target object based on a region of the captured image data except the non-existent region indicated by the non-existent-region data stored in the storage.

An aspect of the present disclosure is a substrate processing apparatus including: a chamber; a substrate holder that is provided in the chamber and holds a substrate; an illuminator that irradiates a capture region including a monitoring target object in the chamber with illumination light; a camera that captures the capture region to generate captured image data; a storage that stores non-existent-region data indicating a position and a shape of a non-existent region indicating at least one of a shadow and a reflected image of an object included in the captured image data; and a controller that monitors the monitoring target object based on comparison between the captured image data and reference image data that includes the monitoring target object that is normal and does not include a region same as the non-existent region indicated by the non-existent-region data stored in the storage.

The influence of the non-existent region can be avoided to monitor the monitoring target object with higher precision.

Therefore, an object of the present disclosure is to provide a technique capable of monitoring the monitoring target object with higher precision.

These and other objects, features, aspects and advantages of the present invention will become more apparent from the following detailed description of the present invention when taken in conjunction with the accompanying drawings.

BRIEF DESCRIPTION OF THE DRAWING

FIG. 1 is a plan view schematically illustrating an example of a configuration of a substrate processing apparatus;

FIG. 4 is a functional block diagram schematically illustrating an example of an internal configuration of a controller;

FIG. 5 is a flowchart illustrating an example of the flow of substrate processing;

FIGS. 13 and 14 are diagrams each schematically illustrating an example of a captured image.

DESCRIPTION OF THE PREFERRED EMBODIMENTS

Figure 2:
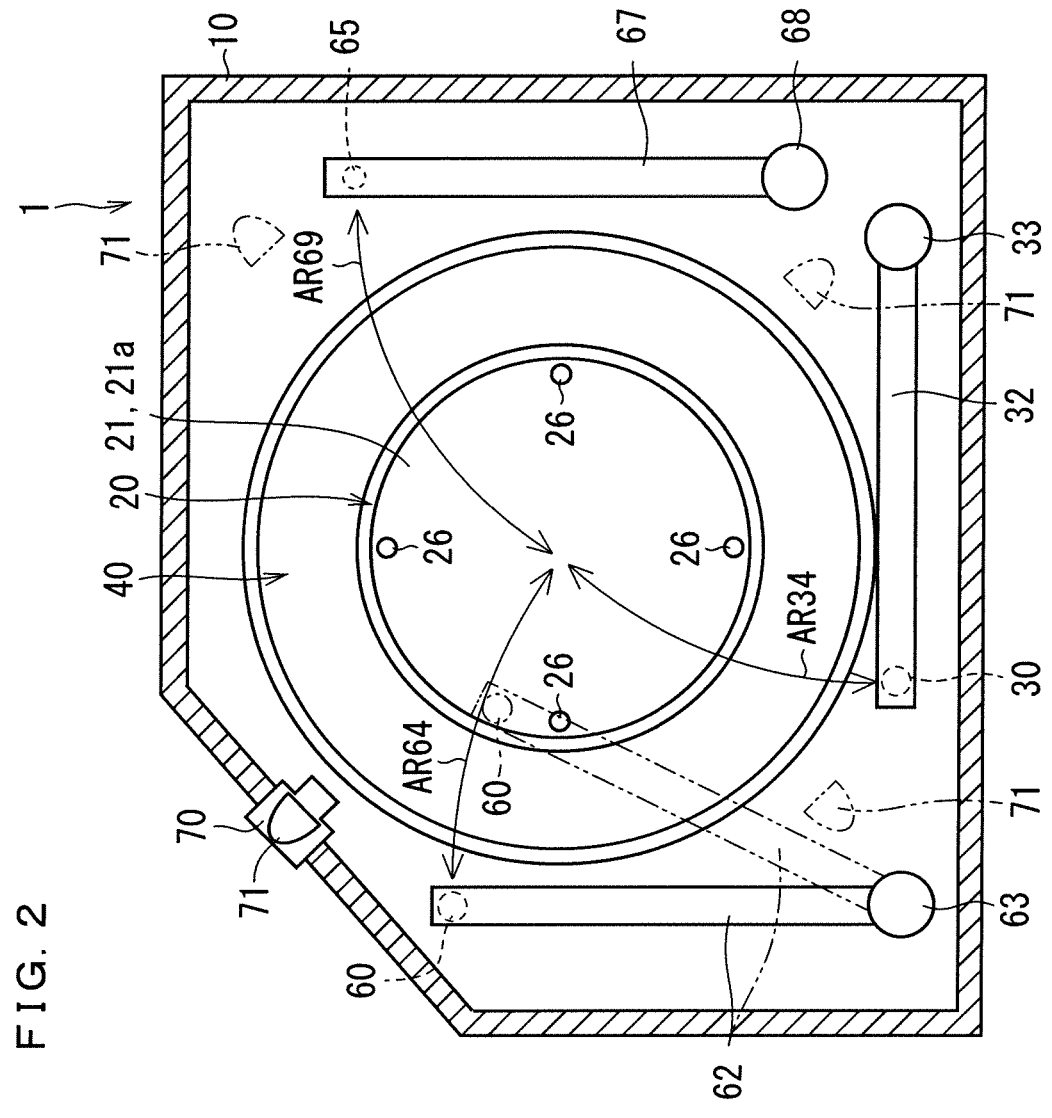
FIG. 2 is a plan view schematically illustrating an example of a configuration of a processing unit according to a first embodiment.

Hereinafter, embodiments will be described with reference to the accompanying drawings. Note that the drawings are schematically illustrated, and omission of the configuration or simplification of the configuration is appropriately made for convenience of description. Furthermore, the relationship between the sizes and positions of the configurations illustrated in the drawings are not necessarily accurately depicted, and may be appropriately changed.

Furthermore, in the following description, similar components are denoted by the same reference numerals and illustrated in the drawings, and names and functions thereof are also similar. Therefore, detailed description thereof may be omitted in order to avoid duplication.

Furthermore, in the following description, even in a case where ordinal numbers, such as "first" or "second", are used, these terms are used for convenience to facilitate understanding of the contents of the embodiments, and are not limited to the order that may be generated by these ordinal numbers.

In a case where an expression indicating a relative or absolute positional relationship (for example, "in one direction", "along one direction", "parallel", "orthogonal", "center", "concentric", "coaxial", or the like) is used, the expression not only strictly represents the positional relationship, but also represents a state of being relatively displaced in an angle or distance to a tolerance or within a range within which a similar function is obtained, unless otherwise specified. In a case where an expression indicating an equal state (for example, "same", "equal", "homogeneous", or the like) is used, the expression not only represents a quantitatively strictly equal state, but also represents a state in which there is a difference to a tolerance or a difference within which a similar function is obtained, unless otherwise specified. In a case where an expression indicating a shape (for example, "quadrangular", "cylindrical", or the like) is used, the expression not only geometrically and strictly represents the shape, but also represents a shape having, for example, unevenness or chamfering within a range within which a similar effect is obtained, unless otherwise specified. In a case where an expression "comprising", "provided with", "equipped with", "including", or "having" one component is used, the expression is not an exclusive expression excluding the presence of other components. In a case where an expression "at least one of A, B, and C" is used, the expression includes only A, only B, only C, any two of A, B, and C, and all of A, B, and C.

<Overall Configuration of Substrate Processing Apparatus>

Figure 1:
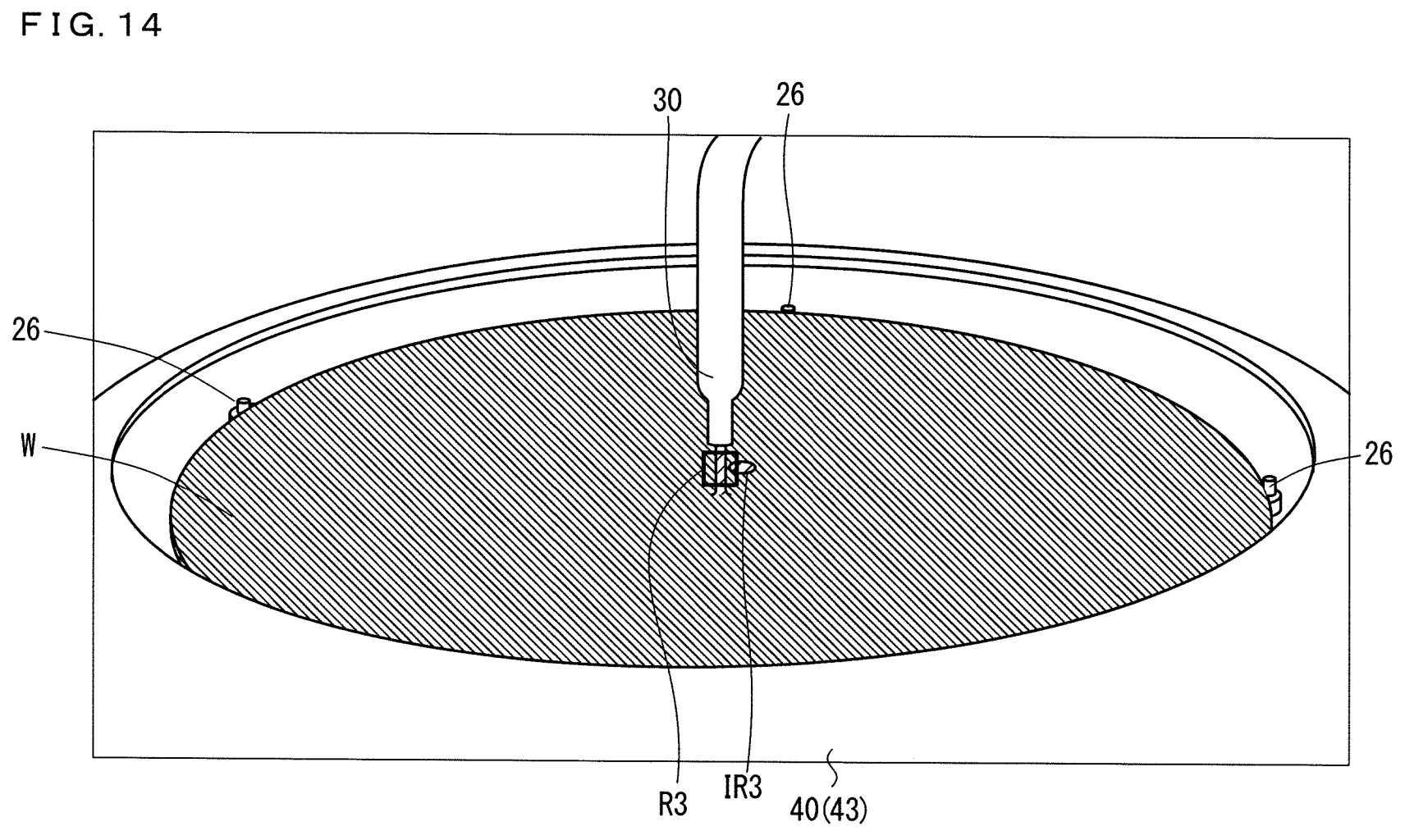

FIG. 1 is a plan view schematically illustrating an example of a configuration of a substrate processing apparatus 100. The substrate processing apparatus 100 is a single-wafer processing apparatus that processes substrates W as processing targets one by one. The substrate processing apparatus 100 performs liquid processing on a substrate W using a chemical liquid and a rinse liquid, such as pure water, and then performs drying processing. A substrate W is, for example, a semiconductor substrate, and has a disk shape. As the chemical liquid, for example, a mixed solution of ammonia and a hydrogen peroxide solution (SC1), a mixed aqueous solution of hydrochloric acid and a hydrogen peroxide solution (SC2), or a diluted hydrofluoric acid (DHF) solution is used. In the following description, a chemical liquid, a rinse liquid, an organic solvent, and the like are collectively referred to as a "processing liquid". Note that the "processing liquid" includes not only a chemical liquid for cleaning processing but also a chemical liquid for removing an unnecessary film, a chemical liquid for etching, and the like.

The substrate processing apparatus 100 includes a plurality of processing units 1, a load port LP, an indexer robot 102, a main conveyance robot 103, and a controller 9.

The load port LP is an interface unit for conveying in and out substrates W between the substrate processing apparatus 100 and the outside. A container (also referred to as a carrier)

containing a plurality of unprocessed substrates W is conveyed into the load port LP from the outside. The load port LP can hold a plurality of the carriers. As described later, each substrate W is taken out from the carrier by the substrate processing apparatus 100, processed, and contained in the carrier again. The carrier containing a plurality of processed substrates W is conveyed out from the load port LP to the outside.

The indexer robot 102 conveys a substrate W between each carrier held in the load port LP and the main conveyance robot 103. The main conveyance robot 103 conveys a substrate W between each processing unit 1 and the indexer robot 102.

The processing unit 1 performs liquid processing and drying processing on one substrate W. In the substrate processing apparatus 100 according to the present embodiment, twelve processing units 1 having similar configurations are arranged. Specifically, four towers each including three processing units 1 stacked in a vertical direction are arranged around the main conveyance robot 103. In FIG. 1, one of the three stacked processing units 1 is schematically illustrated. Note that the number of processing units 1 in the substrate processing apparatus 100 is not limited to twelve, and may be appropriately changed.

The main conveyance robot 103 is installed at the center of the four towers in which the processing units 1 are stacked. The main conveyance robot 103 conveys a substrate W as a processing target received from the indexer robot 102, into each processing unit 1. Furthermore, the main conveyance robot 103 conveys out a processed substrate W from each processing unit 1 and passes the substrate W to the indexer robot 102. The controller 9 controls the operation of each component of the substrate processing apparatus 100.

Hereinafter, one of the twelve processing units 1 mounted in the substrate processing apparatus 100 will be described.

<Processing Unit>

Figure 3:
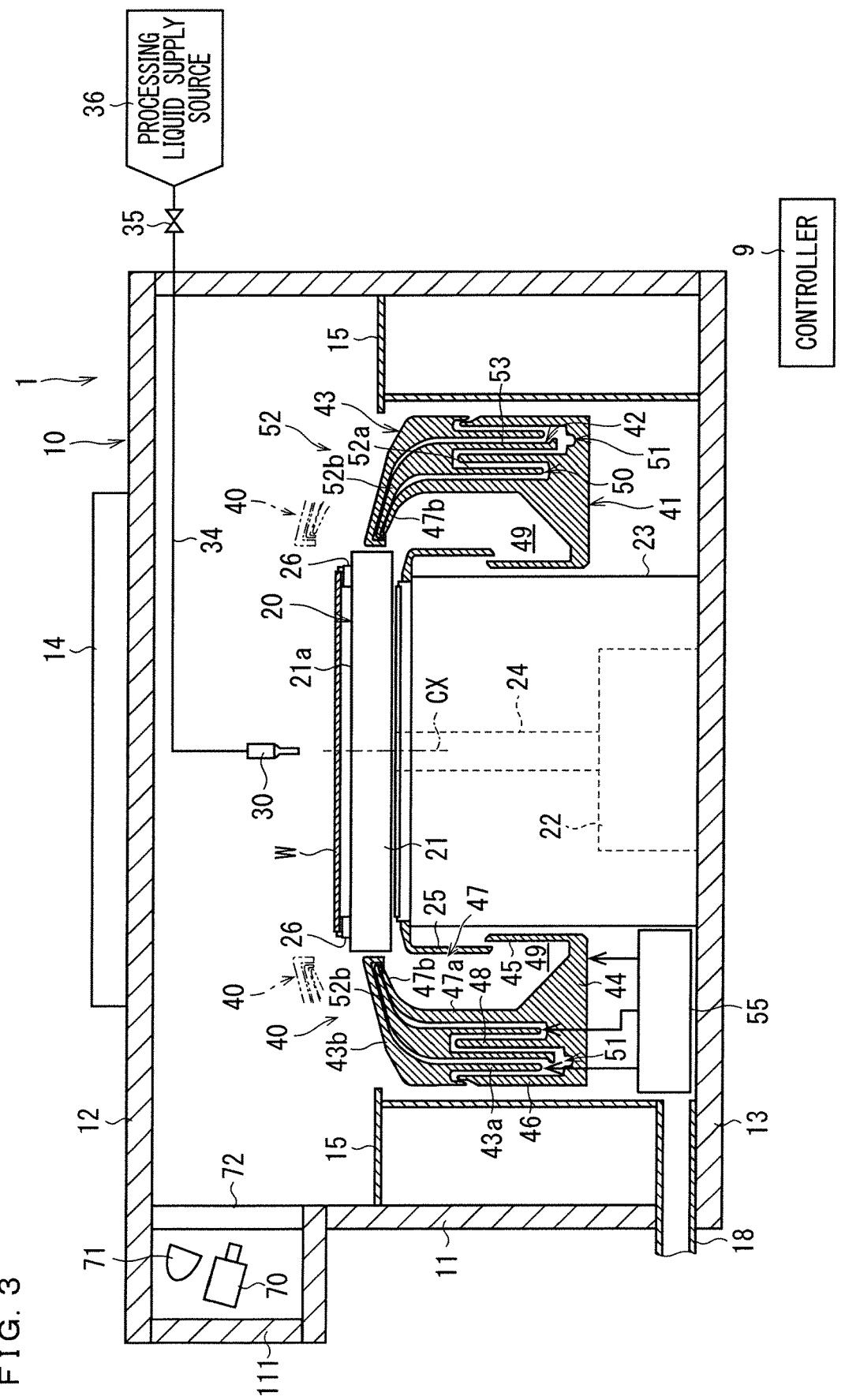
FIG. 3 is a perpendicular cross-sectional view schematically illustrating an example of a configuration of the processing unit according to the first embodiment.

FIG. 2 is a plan view schematically illustrating an example of a configuration of the processing unit 1 according to a first embodiment. FIG. 3 is a perpendicular cross-sectional view schematically illustrating an example of a configuration of the processing unit 1 according to the first embodiment.

In the examples in FIGS. 2 and 3, the processing unit 1 includes a substrate holder 20, a first nozzle 30, a second nozzle 60, a third nozzle 65, a guard unit 40, a camera 70, and an illuminator 71.

In the examples in FIGS. 2 and 3, the processing unit 1 also includes a chamber 10. The chamber 10 includes a side wall 11 along the vertical direction, a ceiling wall 12 that closes the upper side of a space surrounded by the side wall 11, and a floor wall 13 that closes the lower side of the space. A processing space is formed in a space surrounded by the side wall 11, the ceiling wall 12, and the floor wall 13. Provided in part of the side wall 11 of the chamber 10 are a conveyance opening for the main conveyance robot 103 to convey in and out a substrate W, and a shutter for opening and closing the conveyance opening (both of which are not illustrated). The chamber 10 contains the substrate holder 20, the first nozzle 30, the second nozzle 60, the third nozzle 65, and the guard unit 40.

In the example in FIG. 3, a fan filter unit (FFU) 14 is attached to the ceiling wall 12 of the chamber 10 to further clean the air in a clean room where the substrate processing apparatus 100 is installed and supply the air to the processing space in the chamber 10. The fan filter unit 14 includes a fan for taking in air in the clean room and sending the air into the chamber 10, and a filter (for example, a high efficiency particulate air (HEPA) filter), and forms a downward flow of cleaned air in the processing space in the chamber 10. In order to uniformly disperse the cleaned air supplied from the fan filter unit 14, a punched plate having a large number of blow-out holes may be provided immediately under the ceiling wall 12.

The substrate holder 20 holds a substrate W in a horizontal orientation (an orientation in which the normal line is along the vertical direction), and rotates the substrate W on a rotation axis CX (see FIG. 3). The rotation axis CX is an axis along the vertical direction and is through the center portion of the substrate W. The substrate holder 20 is also called a spin chuck. Note that FIG. 2 illustrates the substrate holder 20 in a state of not holding a substrate W.

In the examples in FIGS. 2 and 3, the substrate holder 20 includes a spin base 21 disk-shaped and provided in a horizontal orientation. The outer diameter of the spin base 21 disk-shaped is slightly larger than the diameter of a circular substrate W held by the substrate holder 20 (see FIG. 3). Therefore, the spin base 21 has an upper surface 21*a* facing the entire lower surface of the held substrate W in the vertical direction.

In the examples in FIGS. 2 and 3, a plurality of (four in the present embodiment) chuck pins 26 is erected on the peripheral portion of the upper surface 21*a* of the spin base 21. The plurality of chuck pins 26 is arranged at equal intervals along the circumference corresponding to the periphery of a circular substrate W. Each of the chuck pins 26 is provided in such a manner that the chuck pin 26 can be driven between a holding position where the chuck pin 26 is in contact with the periphery of the substrate W and an open position where the chuck pin 26 is away from the periphery of the substrate W. The plurality of chuck pins 26 is collectively driven by a linkage mechanism (not illustrated) contained in the spin base 21. The substrate holder 20 can hold the substrate W in a horizontal orientation close to the upper surface 21*a* over the spin base 21 by stopping the plurality of chuck pins 26 at the respective holding positions (see FIG. 3), and can release the holding of the substrate W by stopping the plurality of chuck pins 26 at the respective open positions.

In the example in FIG. 3, connected to the lower surface of the spin base 21 is the upper end of a rotating shaft 24 extending along the rotation axis CX. Under the spin base 21, a spin motor 22 that rotates the rotating shaft 24 is provided. The spin motor 22 rotates the rotating shaft 24 on the rotation axis CX to rotate the spin base 21 in a horizontal plane. As a result, the substrate W held by the chuck pins 26 also rotates on the rotation axis CX.

In the example in FIG. 3, a cover member 23 that is tubular is provided in such a manner that the cover member 23 surrounds the spin motor 22 and the rotating shaft 24. The lower end of the cover member 23 is fixed to the floor wall 13 of the chamber 10, and the upper end reaches immediately under the spin base 21. In the example in FIG. 3, the upper end portion of the cover member 23 is provided with a flange-shaped member 25 that protrudes substantially horizontally outward from the cover member 23 and further bends and extends downward.

The first nozzle 30 discharges a processing liquid toward the substrate W to supply the processing liquid to the substrate W. In the example in FIG. 2, the first nozzle 30 is attached to the distal end of a nozzle arm 32. The nozzle arm 32 extends horizontally, and the base end thereof is connected to a nozzle support column 33. The nozzle support column 33 extends along the vertical direction and is provided in such a manner that the nozzle support column 33 can be rotated on an axis along the vertical direction by an arm-driving motor (not illustrated). As indicated by arrows AR34 in FIG. 2, the rotation of the nozzle support column 33 moves the first nozzle 30 in an arc shape between a nozzle processing position and a nozzle standing-by position in a space vertically over the substrate holder 20. The nozzle processing position is a position where the first nozzle 30 discharges the processing liquid onto the substrate W, and is, for example, a position facing the central portion of the substrate W in the vertical direction. The nozzle standing-by position is a position where the first nozzle 30 does not discharge the processing liquid onto the substrate W, and is, for example, a position outside the periphery of the substrate W in a radial direction. This radial direction is the radial direction with respect to the rotation axis CX. FIG. 2 illustrates the first nozzle 30 located at the nozzle standing-by position, and FIG. 3 illustrates the first nozzle 30 located at the nozzle processing position.

As illustrated in FIG. 3, the first nozzle 30 is connected to a processing liquid supply source 36 via a supply pipe 34. The processing liquid supply source 36 includes a tank that stores the processing liquid. The supply pipe 34 is provided with a valve 35. Opening the valve 35 supplies the processing liquid from the processing liquid supply source 36 to the first nozzle 30 through the supply pipe 34 to discharge the processing liquid from a discharge opening formed in a lower end surface of the first nozzle 30. Note that the first nozzle 30 may be configured to be supplied with a plurality of types of processing liquids (including at least pure water).

The second nozzle 60 is attached to the distal end of a nozzle arm 62, and the base end of the nozzle arm 62 is connected to a nozzle support column 63. An arm-driving motor (not illustrated) rotates the nozzle support column 63, so that the second nozzle 60 moves in an arc shape in a space vertically over the substrate holder 20, as indicated by arrows AR64. Similarly, the third nozzle 65 is attached to the distal end of a nozzle arm 67, and the base end of the nozzle arm 67 is connected to a nozzle support column 68. An arm-driving motor (not illustrated) rotates the nozzle support column 68, so that the third nozzle 65 moves in an arc shape in a space vertically over the substrate holder 20, as indicated by arrows AR69.

Similarly to the first nozzle 30, each of the second nozzle 60 and the third nozzle 65 is connected to a processing liquid supply source (not illustrated) via a supply pipe (not illustrated). Each supply pipe is provided with a valve, and the valve is opened or closed to switch between the supply and stop of the processing liquid. Note that the number of nozzles provided in the processing unit 1 is not limited to three, and may be one or more.

In liquid processing, the processing unit 1 causes, for example, the first nozzle 30 to discharge the processing liquid toward the upper surface of a substrate W while rotating the substrate W with the substrate holder 20. The processing liquid that has landed on the upper surface of the substrate W receives the centrifugal force accompanying the rotation and thus spreads over the upper surface of the substrate W, and scatters from the periphery of the substrate W. By this liquid processing, processing according to the type of the processing liquid can be performed on the upper surface of the substrate W.

The guard unit 40 is a member for receiving the processing liquid scattering from the periphery of the substrate W. The guard unit 40 has a tubular shape surrounding the substrate holder 20, and includes, for example, a plurality of guards that can be individually lifted and lowered. The guards may also be referred to as processing cups. In the example in FIG. 3, an inner guard 41, a middle guard 42, and an outer guard 43 are illustrated as the plurality of guards. Each of the guards 41 to 43 surrounds the substrate holder 20 and has a shape substantially rotationally symmetric with respect to the rotation axis CX.

In the example in FIG. 3, the inner guard 41 integrally includes a bottom portion 44, an inner wall portion 45, an outer wall portion 46, a first guide portion 47, and a middle wall portion 48. The bottom portion 44 has an annular shape in plan view. The inner wall portion 45 and the outer wall portion 46 have a cylindrical shape, and are erected on an inner periphery and an outer periphery of the bottom portion 44, respectively. The first guide portion 47 includes a cylindrical portion 47a having a cylindrical shape and erected on the bottom portion 44 between the inner wall portion 45 and the outer wall portion 46, and a sloping portion 47b that is the closer to the rotation axis CX, the more vertically upward from the upper end of the cylindrical portion 47a. The middle wall portion 48 has a cylindrical shape, and is erected on the bottom portion 44 between the first guide portion 47 and the outer wall portion 46.

In a state where the guards 41 to 43 are lifted (see imaginary lines in FIG. 3), the processing liquid that has scattered from the periphery of the substrate W is received by the inner peripheral surface of the first guide portion 47, flows down along the inner peripheral surface, and is received by a disposal groove 49. The disposal groove 49 is an annular groove formed by the inner wall portion 45, the first guide portion 47, and the bottom portion 44. Connected to the disposal groove 49 is a gas and liquid ejection mechanism (not illustrated) for ejecting the processing liquid and forcibly ejecting gas in the disposal groove 49.

The middle guard 42 integrally includes a second guide portion 52, and a processing liquid separation wall 53 that is cylindrical and connected to the second guide portion 52. The second guide portion 52 includes a cylindrical portion 52a having a cylindrical shape, and a sloping portion 52b that is the closer to the rotation axis CX, the more vertically upward from the upper end of the cylindrical portion 52a. The sloping portion 52b is located vertically over the sloping portion 47b of the inner guard 41, and is provided over the sloping portion 47b in the vertical direction. The cylindrical portion 52a is contained in an inside collection groove 50 that is annular. The inside collection groove 50 is a groove formed by the first guide portion 47, the middle wall portion 48, and the bottom portion 44.

In a state where only the guards 42 and 43 are lifted, the processing liquid from the periphery of the substrate W is received by the inner peripheral surface of the second guide portion 52, flows down along the inner peripheral surface, and is received by the inside collection groove 50.

The processing liquid separation wall 53 has a cylindrical shape, and the upper end thereof is connected to the second guide portion 52. The processing liquid separation wall 53 is contained in an outside collection groove 51 that is annular. The outside collection groove 51 is a groove formed by the middle wall portion 48, the outer wall portion 46, and the bottom portion 44.

The outer guard 43 is located outside the middle guard 42, and has a function as a third guide portion that guides the processing liquid to the outside collection groove 51. The outer guard 43 integrally includes a cylindrical portion 43a having a cylindrical shape, and a sloping portion 43b that is the closer to the rotation axis CX, the more vertically upward from the upper end of the cylindrical portion 43a. The cylindrical portion 43a is contained in the outside collection groove 51, and the sloping portion 43b is located vertically over the sloping portion 52b and is provided over the sloping portion 52b in an up-down direction.

In a state where only the outer guard 43 is lifted, the processing liquid from the periphery of the substrate W is received by the inner peripheral surface of the outer guard 43, flows down along the inner peripheral surface, and is received by the outside collection groove 51.

Connected to the inside collection groove 50 and the outside collection groove 51 is a collection mechanism for collecting the processing liquid in a collection tank provided outside the processing unit 1 (both of which are not illustrated).

The guards 41 to 43 can be lifted and lowered by a guard-lifting-and-lowering mechanism 55. The guard-lifting-and-lowering mechanism 55 lifts and lowers the guards 41 to 43 between respective guard processing positions and guard standing-by positions, so that the guards 41 to 43 do not collide with each other. The guard processing position is a position where the upper-end peripheral portion of a target guard as a lifting or lowering target is above the upper surface of the substrate W, and the guard standing-by position is a position where the upper-end peripheral portion of a target guard is below the upper surface 21a of the spin base 21. This upper-end peripheral portion is an annular portion of the target guard that forms the upper end opening of the target guard. In the example in FIG. 3, the guards 41 to 43 are located at the guard standing-by positions. The guard-lifting-and-lowering mechanism 55 includes, for example, a ball screw mechanism and a motor or an air cylinder.

A partition sheet 15 is provided to vertically partition the inside space of the chamber 10 around the guard unit 40. A through hole and a notch (not illustrated) may be formed through the partition sheet 15 in the thickness direction, and in the present embodiment, formed through the partition sheet 15 are through holes through which the nozzle support column 33, the nozzle support column 63, and the nozzle support column 68 are passes. An outer peripheral end of the partition sheet 15 is connected to the side wall 11 of the chamber 10. Furthermore, an inner periphery of the partition sheet 15 surrounding the guard unit 40 is formed in a circular shape having a diameter larger than the outer diameter of the outer guard 43. Therefore, the partition sheet 15 does not obstruct the lifting and lowering of the outer guard 43.

In the example in FIG. 3, the partition sheet 15 is part of the side wall 11 of the chamber 10, and is provided with a gas ejection duct 18 in the vicinity of the floor wall 13. The gas ejection duct 18 is communicably connected to a gas ejection mechanism (not illustrated). Of cleaned air flowing down in the chamber 10, the air passing between the guard unit 40 and the partition sheet 15 is ejected through the gas ejection duct 18 to the outside of the apparatus.

The camera 70 is used to monitor the states of monitoring target objects in the chamber 10. The monitoring target objects include, for example, at least one of the substrate holder 20, the first nozzle 30, the second nozzle 60, the third nozzle 65, and the guard unit 40. The camera 70 captures a capture region including the monitoring target objects to generate captured image data (hereinafter simply referred to as a captured image), and outputs the captured image to the controller 9. As will be described in detail later, the controller 9 monitors the states of the monitoring target objects on the basis of the captured image.

The camera 70 includes a solid-state image sensor, such as a charge coupled device (CCD) or a complementary metal oxide semiconductor (CMOS), and an optical system, such as a lens. In the example in FIG. 3, the camera 70 is installed at a capture position vertically above the substrate W held by the substrate holder 20. In the example in FIG. 3, the capture position is set vertically above the partition sheet 15 and outside the guard unit 40 in a radial direction. This radial direction is the radial direction with respect to the rotation axis CX.

In the example in FIG. 3, in the side wall 11 of the chamber 10, a recess for containing the camera 70 (hereinafter referred to as the wall recess 111) is formed. The wall recess 111 has a shape set outward back than the rest of the side wall 11. The camera 70 is contained inside the wall recess 111. In the example in FIG. 3, a transparent member 72 is provided in front of the camera 70 with respect to the capture direction. The transparent member 72 has high light transmittance for the wavelength of light detected by the camera 70. Therefore, the camera 70 can capture the capture region in the processing space through the transparent member 72. In other words, the transparent member 72 is provided between the camera 70 and the capture region. The transmittance of the transparent member 72 in the detection wavelength range of the camera 70 is, for example, 60% or more, preferably 80% or more. The transparent member 72 is formed of, for example, a transparent material, such as quartz glass. In the example in FIG. 3, the transparent member 72 has a sheet shape, and the transparent member 72 and the wall recess 111 of the side wall 11 form a space that contains the camera 70. Since the transparent member 72 is provided, the camera 70 can be protected from the processing liquid and volatile components of the processing liquid in the processing space.

The capture region of the camera 70 includes, for example, the substrate holder 20 and part of the guard unit 40. In the example in FIG. 3, the camera 70 captures the capture region obliquely downward from the capture position. In other words, the capture direction of the camera 70 slopes vertically downward from a horizontal direction.

In the example in FIG. 3, the illuminator 71 is provided at a position vertically above the partition sheet 15. As a specific example, the illuminator 71 is also provided inside the wall recess 111. The illuminator 71 includes a light source, such as a light emitting diode, and irradiates the capture region with the illumination light. In a case where the inside of the chamber 10 is a dark room, the controller 9 may control the illuminator 71 so that the illuminator 71 irradiates the capture region when the camera 70 performs the capturing. The illumination light from the illuminator 71 passes through the transparent member 72, and the inside of the processing space is irradiated with the illumination light.

A hardware configuration of the controller 9 is the same as that of a general computer. That is, the controller 9 includes a data processing unit, such as a central processing unit (CPU), that performs various types of arithmetic processing, a non-transitory storage unit, such as a read only memory (ROM), that is a read-only memory for storing basic programs, and a temporary storage unit, such as a random access memory (RAM), that is a readable and writable memory for storing various types of information. The CPU of the controller 9 executes a predetermined processing program, so that each operation mechanism of the substrate processing apparatus 100 is controlled by the controller 9, and processing in the substrate processing apparatus 100 proceeds. Note that the controller 9 may be implemented by a dedicated hardware circuit that does not need software for the implementation of the functions of the controller 9.

FIG. 4 is a functional block diagram schematically illustrating an example of an internal configuration of the controller 9. As illustrated in FIG. 4, the controller 9 includes a non-existent-region-identifying unit 91, a monitoring processing unit 92, and a processing control unit 93.

The non-existent-region-identifying unit 91 identifies a non-existent region, such as a shadow, included in a captured image. The non-existent-region-identifying unit 91 will be described in detail later.

The monitoring processing unit 92 monitors the states of monitoring target objects on the basis of a captured image. The monitoring processing unit 92 will also be described in detail later.

The processing control unit 93 controls each component of the processing unit 1. More specifically, the processing control unit 93 controls the spin motor 22, various valves, such as the valve 35, arm-driving motors that rotate the respective nozzle support columns 33, 63, and 68, the guard-lifting-and-lowering mechanism 55, the fan filter unit 14, and the camera 70. The processing control unit 93 controls these configurations according to a predetermined procedure, so that the processing unit 1 can perform processing on a substrate W.

<Example of Flow of Substrate Processing>

Here, an example of a specific flow of processing on a substrate W will be briefly described. FIG. 5 is a flowchart illustrating an example of the flow of substrate processing. Initially, the guards 41 to 43 stop at the respective guard standing-by positions, and the nozzles 30, 60, and 65 stop at the respective nozzle standing-by positions. Note that although the controller 9 controls each configuration to make the configuration execute a predetermined operation to be described later, in the following description, each configuration itself will be adopted as a main constituent of the operation.

First, the main conveyance robot 103 conveys an unprocessed substrate W into the processing unit 1, and the substrate holder 20 holds the substrate W (step S1: a conveying-in and holding step). Since the guard unit 40 initially stops at the guard standing-by position, the collision between the hand of the main conveyance robot 103 and the guard unit 40 can be avoided when the substrate W is conveyed in. When the substrate W is passed to the substrate holder 20, the plurality of chuck pins 26 moves to the respective holding positions, so that the plurality of chuck pins 26 holds the substrate W.

Next, the spin motor 22 starts the rotation of the substrate W (step S2: a rotation start step). Specifically, the spin motor 22 rotates the spin base 21 to rotate the substrate W held by the substrate holder 20.

Next, the processing unit 1 performs various liquid processing on the substrate W (step S3: a liquid processing step). For example, the processing unit 1 performs chemical liquid processing. First, the guard-lifting-and-lowering mechanism 55 lifts one of the guards 41 to 43 corresponding to the chemical liquid to the guard processing position. The guard for the chemical liquid is not particularly limited, but may be, for example, the outer guard 43. In this case, the guard-lifting-and-lowering mechanism 55 stops the inner guard 41 and the middle guard 42 at the respective guard standing-by positions, and lifts the outer guard 43 to the guard processing position.

Next, the processing unit 1 supplies the chemical liquid to the substrate W. Here, it is assumed that the first nozzle 30 supplies the processing liquid. Specifically, the arm-driving motor moves the first nozzle 30 to the nozzle processing position, and the valve 35 is opened to discharge the chemical liquid from the first nozzle 30 toward the substrate W. As a result, the chemical liquid spreads over the upper surface of the rotating substrate W, and scatters from the periphery of the substrate W. At this time, the chemical liquid acts on the upper surface of the substrate W, and processing that corresponds to the chemical liquid (for example, cleaning processing) is performed on the substrate W. The chemical liquid that has scattered from the periphery of the substrate W is received by the inner peripheral surface of the guard unit 40 (for example, the outer guard 43). When the chemical liquid processing is sufficiently performed, the processing unit 1 stops the supply of the chemical liquid.

Next, the processing unit 1 performs rinse processing on the substrate W. The guard-lifting-and-lowering mechanism 55 adjusts the lifting lowering state of the guard unit 40, as necessary. That is, in a case where the guard for the rinse liquid is different from the guard for the chemical liquid, the guard-lifting-and-lowering mechanism 55 moves one of the guards 41 to 43 corresponding to the rinse liquid to the guard processing position. The guard for the rinse liquid is not particularly limited, but may be the inner guard 41. In this case, the guard-lifting-and-lowering mechanism 55 lifts the guards 41 to 43 to the respective guard processing positions.

Next, the first nozzle 30 discharges the rinse liquid toward the upper surface of the substrate W. The rinse liquid is, for example, pure water. The rinse liquid spreads over the upper surface of the rotating substrate W, and scatters from the periphery of the substrate W while forcibly making the chemical liquid on the substrate W flow. The processing liquid that has scattered from the periphery of the substrate W (mainly the rinse liquid) is received by the inner peripheral surface of the guard unit 40 (for example, the inner guard 41). When the rinse processing is sufficiently performed, the processing unit 1 stops the supply of the rinse liquid.

The processing unit 1 may supply a volatile rinse liquid, such as isopropyl alcohol having high volatility, to the substrate W, as necessary. Note that in a case where the guard for the volatile rinse liquid is different from the guard for the rinse liquid described above, the guard-lifting-and-lowering mechanism 55 may move one of the guards 41 to 43 corresponding to the volatile rinse liquid to the guard processing position. When the rinse processing ends, the first nozzle 30 moves to the nozzle standing-by position.

Next, the processing unit 1 performs drying processing on the substrate W (step S4: a drying step). For example, the spin motor 22 increases the rotation speed of the substrate W to dry the substrate W (what is called spin drying). In the drying processing, the processing liquid that has scattered from the periphery of the substrate W is also received by the inner peripheral surface of the guard unit 40. When the drying processing is sufficiently performed, the spin motor 22 stops the rotation of the substrate W.

Next, the guard-lifting-and-lowering mechanism 55 lowers the guard unit 40 to the guard standing-by position (step S5: a guard lowering step). That is, the guard-lifting-and-lowering mechanism 55 lowers the guards 41 to 43 to the respective guard standing-by positions.

Next, the substrate holder 20 releases the holding of the substrate W, and the main conveyance robot 103 takes out the processed substrate W from the processing unit 1 (step S6: a holding-release and conveying-out step). Since the guard unit 40 stops at the guard standing-by position when the substrate W is conveyed out, it is possible to avoid the collision between the hand of the main conveyance robot 103 and the guard unit 40.

<Monitoring>

The processing on a substrate W is performed by the above components appropriately operating. Conversely, if at least one of the above components cannot appropriately operate, the processing on the substrate W may be impaired. For example, if the chuck pins 26 cannot move to the holding positions in the holding and conveying-in step, the substrate holder 20 cannot appropriately hold the substrate W.

Therefore, the processing unit 1 uses at least one of the above components as a monitoring target object, and monitors the state of the monitoring target object. Hereinafter, a case where the processing unit 1 monitors the positions of the chuck pins 26 of the substrate holder 20 as a monitoring target object will be described.

<Non-Existent Region: Shadow>

Figure 6:
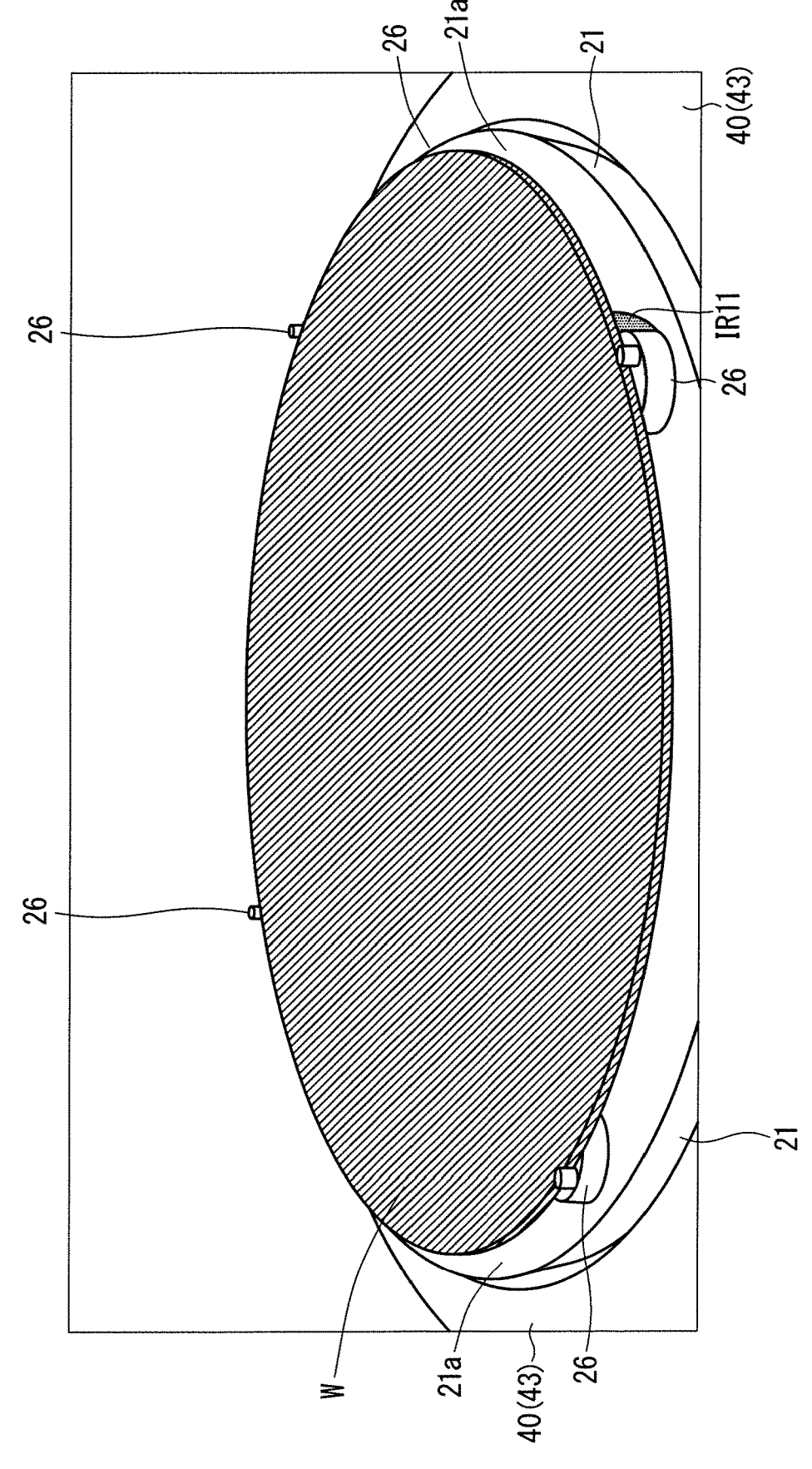
FIG. 6 is a diagram schematically illustrating an example of a captured image generated by a camera capturing a capture region.

FIG. 6 is a diagram schematically illustrating an example of a captured image generated by the camera 70 capturing the capture region. In the example in FIG. 6, the entire upper surface of a substrate W held by the substrate holder 20 is included in the captured image. That is, the camera 70 is installed such that the entire substrate W is included in the capture region. Here, since the camera 70 captures the capture region obliquely downward, the upper surface of the substrate W having a circular shape in plan view has an elliptical shape in the captured image.

In the captured image in FIG. 6, the substrate holder 20 holds the substrate W, and the guard unit 40 is located at the guard standing-by position. That is, the plurality of chuck pins 26 of the substrate holder 20 stops at the holding positions. The captured image in FIG. 6 is obtained, for example, by the camera 70 capturing the capture region while the illuminator 71 irradiates the capture region with the illumination light, in a state where the substrate holder 20 holds the substrate W in a holding and conveying-in step (step S1).

The captured image in FIG. 6 includes four chuck pins 26. Here, for the sake of simplicity, the description will be given in which the lowermost chuck pin 26 in the captured image is focused on. The captured image in FIG. 6 also includes a shadow of the chuck pin 26 due to the illumination light. In FIG. 6, a region indicating a shadow of an object (here, a shadow of the chuck pin 26 itself) is illustrated as a non-existent region IR11. In the example in FIG. 6, the non-existent region IR11 is located to the right of the chuck pin 26 and is adjacent to the chuck pin 26.

If the chuck pin 26 is black, the chuck pin 26 and the shadow have the same color, and thus it is difficult to distinguish the chuck pin 26 from the shadow in the captured image. That is, it is difficult to grasp the shape of the chuck pin 26 in the captured image. When the controller 9 monitors the position of the chuck pin 26 using also such a non-existent region IR11, there is a possibility that the monitoring precision decreases due to the influence of the non-existent region IR11.

<Setting-Up Processing Step>

Therefore, in the present embodiment, a setting-up processing step is performed before the monitoring processing is performed. This setting-up processing step is processing for identifying the non-existent region IR11 in a captured image. The setting-up processing step is performed, for example, in a state where the substrate processing apparatus 100 is not performing processing on a substrate W, as a more specific example, at the time of installation of the substrate processing apparatus 100.

Figure 7:
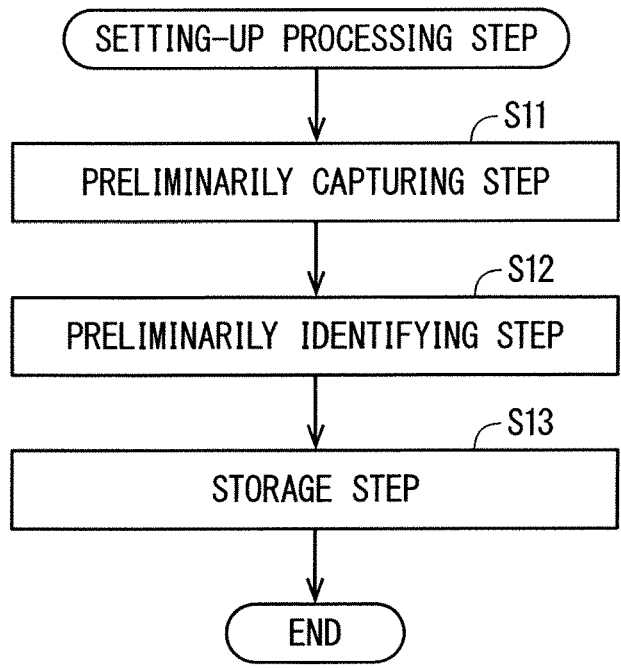
FIG. 7 is a flowchart illustrating an example of a flowchart of a setting-up processing step.

FIG. 7 is a flowchart illustrating an example of the setting-up processing step. First, while the illuminator 71 sequentially irradiates the capture region with the illumination light in a plurality of irradiation modes, the camera 70 sequentially captures the capture region in each irradiation mode to generate a plurality of captured images corresponding to the plurality of irradiation modes (step S11: a preliminarily capturing step). This plurality of irradiation modes includes, for example, modes in which the capture region is irradiated with illumination light from respective irradiation positions different from each other. That is, the capture region is sequentially irradiated with the illumination light while the irradiation position is changed, and the camera 70 captures the capture region each time. As a specific example, the camera 70 captures the capture region in a state where the capture region is irradiated with illumination light from a first irradiation position, and then the camera 70 captures the capture region in a state where the capture region is irradiated with illumination light from a second irradiation position different from the first irradiation position. As a result, a plurality of captured images corresponding to the plurality of respective irradiation positions can be obtained. Note that hereinafter, a captured image generated in the setting-up processing step may be referred to as a preliminarily captured image. This preliminarily captured image is an abbreviation for preliminarily captured image data.

Figure 8:
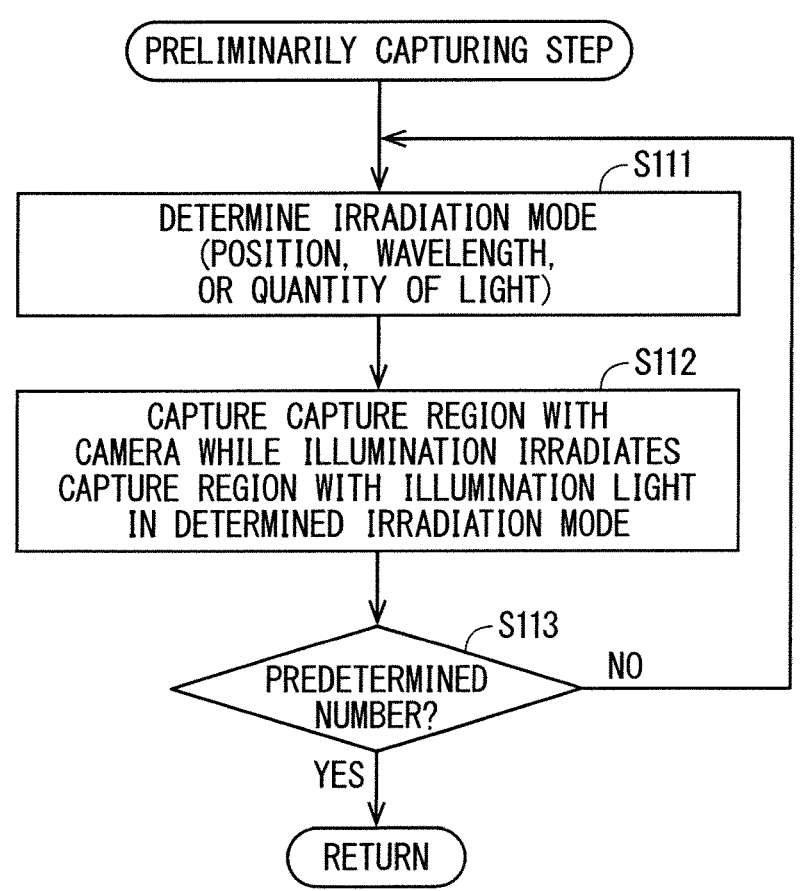
FIG. 8 is a flowchart illustrating a specific example of a preliminarily capturing step.

FIG. 8 is a flowchart illustrating a specific example of the above-described preliminarily capturing step. First, an irradiation mode is determined (step S111). Here, an irradiation position is determined as the irradiation mode. For example, the installation position of the illuminator 71 adjacent to the camera 70 is adopted as a first irradiation mode (that is, a first irradiation position). The illuminator 71 is an illuminator provided in the space that contains the camera 70.

Next, while the illuminator 71 irradiates the capture region with the illumination light from the determined irradiation position (here, the first irradiation position), camera 70 captures the capture region to generate a preliminarily captured image (step S112). The camera 70 outputs the preliminarily captured image to the controller 9. This preliminarily captured image is, for example, similar to the captured image in FIG. 6.

Next, the controller 9 or the operator determines whether or not a predetermined number of preliminarily captured images have been generated (step S113). In a case where the predetermined number of preliminarily captured images have not been generated yet, the next irradiation mode (here, an irradiation position) is determined (step S111). As a specific example, an irradiation position different from the installation position of the illuminator 71 adjacent to the camera 70 is adopted as a second irradiation mode (a second irradiation position). In the example in FIG. 2, prospective irradiation positions are indicated by illuminators 71 of imaginary lines. In the example in FIG. 2, the plurality of irradiation positions is set at substantially equal intervals around the capture region in such a manner that the plurality of irradiation positions surrounds the capture region in plan view. Note that in the setting-up processing step, the operator may sequentially attach a removable illuminator 71 different from the illuminator 71 close to the camera 70 to each prospective irradiation position. Alternatively, illuminators 71 for installation use may be provided at the irradiation positions indicated by the imaginary lines in FIG. 2. Here, it is assumed that an irradiation position in the vicinity of the nozzle support column 63 is adopted as a second irradiation position.

Figure 9:
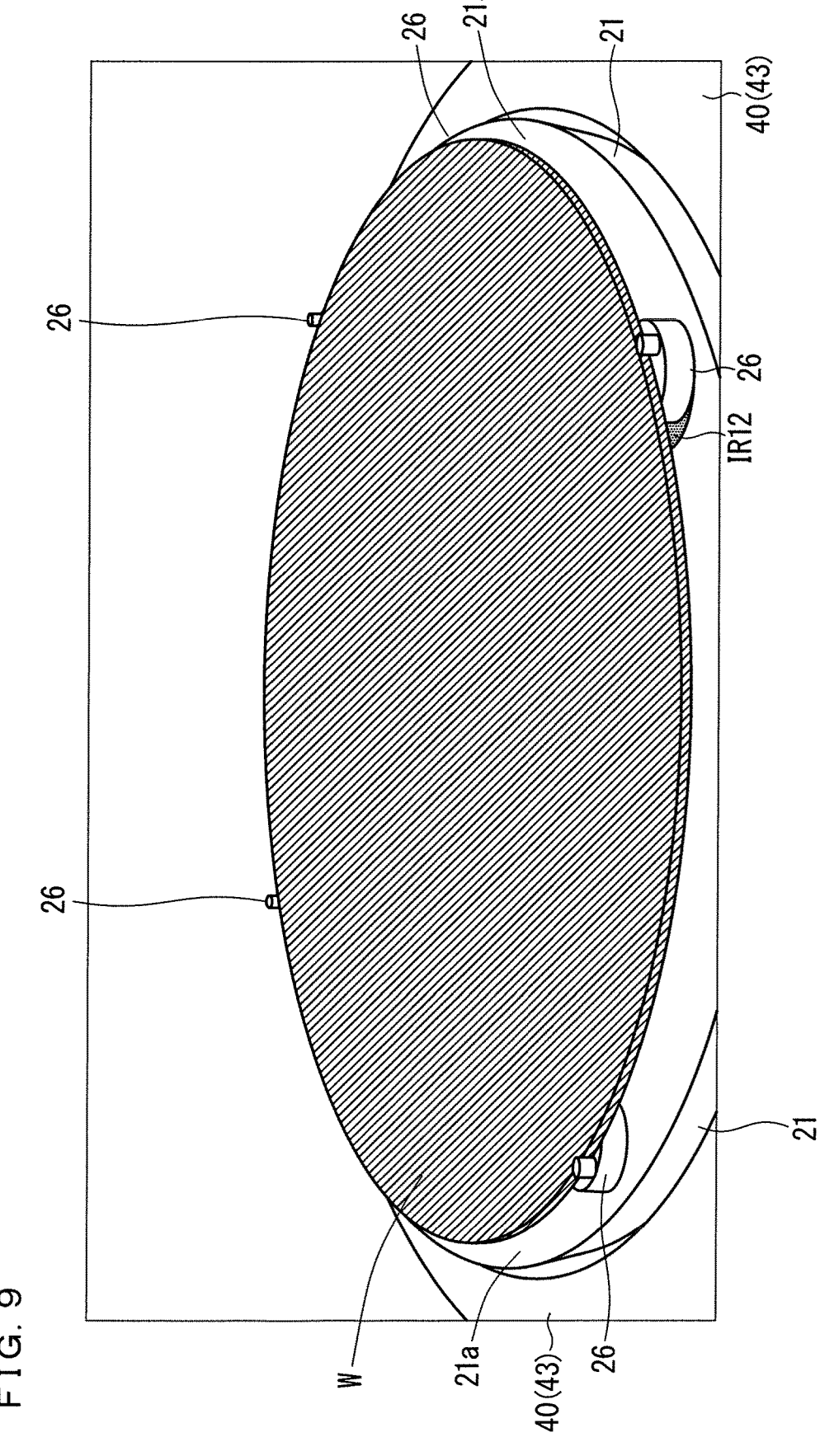
FIG. 9 is a diagram schematically illustrating an example of an image captured when illumination light is emitted from an irradiation position different from that in FIG. 6.

Next, while the illuminator 71 irradiates the capture region with the illumination light from the determined irradiation position (here, the second irradiation position), the camera 70 captures the capture region to generate a preliminarily captured image (step S112). The camera 70 outputs this preliminarily captured image to the controller 9. FIG. 9 is a diagram schematically illustrating an example of an image captured when the illumination light is emitted from an irradiation position different from that in FIG. 6 (here, the second irradiation position). In the example in FIG. 9, a region indicating a shadow of the chuck pin 26 is illustrated as a non-existent region IR12. Since the irradiation positions are different from each other, the position and shape of the non-existent region IR12 are different from the position and shape of the non-existent region IR11. In the example in FIG. 6, the non-existent region IR11 is located to the right of the chuck pin 26 and adjacent to the chuck pin 26, and in the example in FIG. 9, the non-existent region IR12 is located to the left of the chuck pin 26 and adjacent to the chuck pin 26.

That is, between the captured images in FIGS. 6 and 9, the positions and shapes of the existent, such as the chuck pin 26, do not depend on the irradiation position and are substantially the same, whereas the positions and shapes of the shadows of the chuck pin 26 are different from each other.

Next, the controller 9 or the operator determines whether or not a predetermined number of preliminarily captured images have been acquired (step S113). Here, for the sake of simplicity, it is assumed that the predetermined number is two. In this case, the preliminarily capturing step ends. Note that in a case where the operator has attached a removable illuminator 71, the illuminator 71 may be removed after the capturing.

Next, on the basis of a difference between the plurality of preliminarily captured images, the non-existent-region-identifying unit 91 of the controller 9 identifies the non-existent region IR11 included in the image preliminarily captured when the illumination light is irradiated in the first irradiation mode (step S12: a preliminarily identifying step). More specifically, first, the non-existent-region-identifying unit 91 generates difference image data (hereinafter simply referred to as a difference image) between the captured image in FIG. 6 and the captured image in FIG. 9. That is, the non-existent-region-identifying unit 91 performs a subtraction between pixel values of the same coordinate in the captured image in FIG. 6 and in the captured image in FIG. 9 to generate a difference image. Since the existent, such as the chuck pins 26, is substantially the same between the captured images in FIGS. 6 and 9, the pixel values of a pixel group indicating the existent, such as the chuck pins 26, in the difference image are substantially zero. On the other hand, since the shadows are different from each other between the captured images in FIGS. 6 and 9, the pixel values of the pixel groups in the non-existent region IR11 and the non-existent region IR12 have values different from zero in the difference image. Furthermore, in the difference image, the positive and negative of the pixel values in the non-existent region IR11 are opposite to the positive and negative of the pixel values in the non-existent region IR12.

Therefore, the non-existent-region-identifying unit 91 can identify the non-existent region IR11 on the basis of the difference image. In a case where the pixel values of the non-existent region IR11 are positive in the difference image, for example, the non-existent-region-identifying unit 91 may compare each pixel of the difference image with a preset positive threshold, and identify a pixel group having pixel values larger than the threshold, as the non-existent region IR11.

Note that in the above example, two is adopted as the predetermined number, but any number that is three or more may be adopted. For example, FIG. 2 illustrates four irradiation positions (illuminators 71) around the capture region at equal intervals (for example, at intervals of 90 degrees). While the capture region is sequentially irradiated with the illumination light from these irradiation positions, the camera 70 may capture the capture region each time. In this case, four preliminarily captured images corresponding to the four irradiation positions can be obtained. Since the irradiation positions are different from each other, the non-existent regions indicating shadows are different from each other among the four preliminarily captured images.

In a case where three or more preliminarily captured images are acquired, the non-existent-region-identifying unit 91 may identify the non-existent region IR11 on the basis of a difference between the preliminarily captured image corresponding to the first irradiation position and average image data of the plurality of preliminarily captured images (hereinafter simply referred to as an average image). The average image is obtained by dividing the sum of the pixel values of the same coordinates by the number of the preliminarily captured images. For this reason, although the average image includes all the shadows in the plurality of preliminarily captured images, the densities of the shadows are small. That is, this average image can be made close to an image including only the existent without a shadow.

In the difference image between the preliminarily captured image corresponding to the first irradiation position and the average image, the absolute value of each pixel value in a region except the non-existent region IR11 is small, and the absolute value of each pixel value in the non-existent region IR11 is large. Therefore, the non-existent-region-identifying unit 91 compares, for each pixel, the absolute value of the pixel value of the difference image with a predetermined absolute threshold, and identifies a pixel group having absolute values larger than the absolute threshold, as the non-existent region IR11.

Since in the difference image between the preliminarily captured image and the average image, the absolute values of the pixel values of a non-existent region except the non-existent region IR11 can be made smaller, the non-existent-region-identifying unit 91 can identify the non-existent region IR11 in the preliminarily captured image with higher precision.

Next, the controller 9 stores non-existent-region data indicating the position and shape of the non-existent region IR11 in a storage 94 (step S13: a storage step). The storage 94 is, for example, a non-transitory memory. The non-existent-region data may be data indicating a pixel group belonging to the non-existent region IR11.

In such a setting-up processing step, the non-existent region IR11 in an image captured when the illumination light is emitted in the first irradiation mode is preliminarily identified, and the non-existent-region data indicating the non-existent region IR11 is preliminarily stored in the storage 94. The non-existent-region data stored in the storage 94 is used for monitoring processing as described later.

<Monitoring Processing>

Next, an example of monitoring processing will be described. Here, the monitoring processing unit 92 monitors the positions of the chuck pins 26 in the processing on a substrate W.

Figure 10:
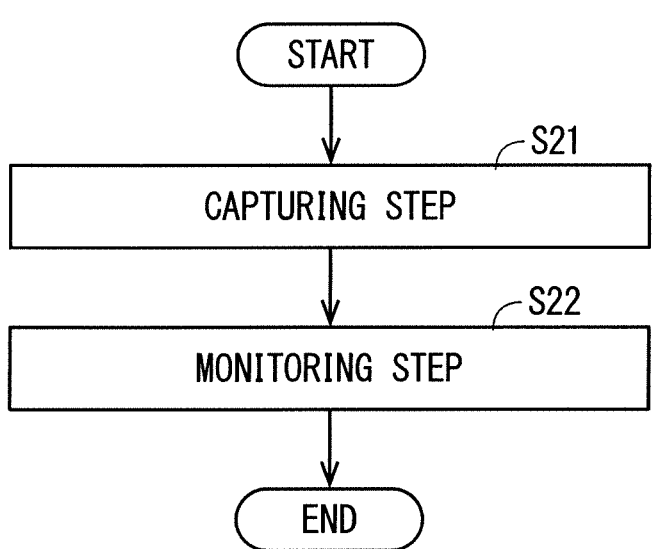
FIG. 10 is a flowchart illustrating an example of monitoring processing.
Figure 11:
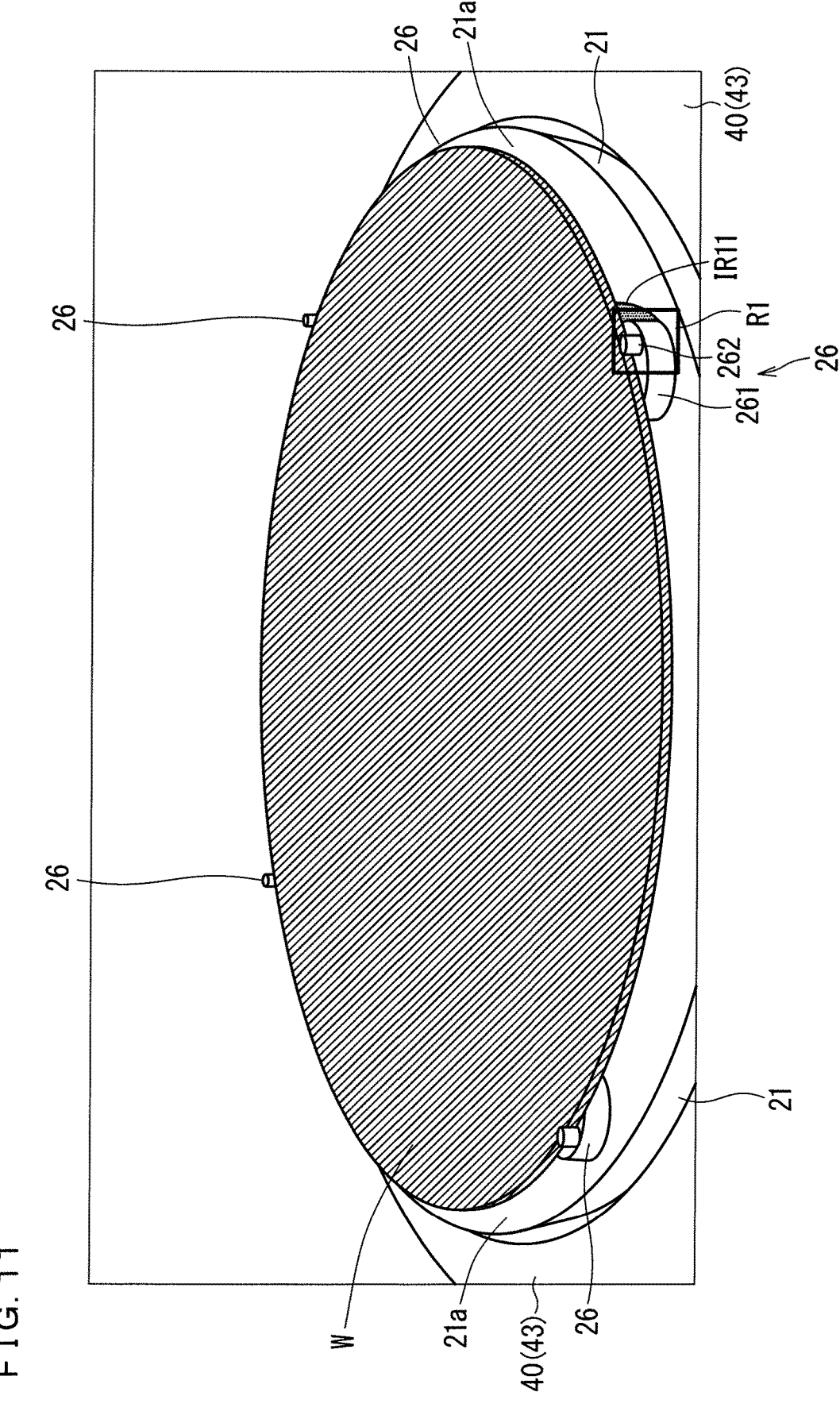
FIG. 11 is a diagram schematically illustrating an example of a captured image generated in a capturing step.

FIG. 10 is a flowchart illustrating an example of the monitoring processing. This monitoring processing is executed after the setting-up processing step. First, while the illuminator 71 irradiates the capture region with the illumination light in the first irradiation mode, the camera 70 captures the capture region to generate a captured image (step S21: a capturing step). This capturing step is performed, for example, after in a holding and conveying-in step (step S1), the controller 9 outputs a control signal to a pin-driving unit to move the chuck pins 26 to the holding positions. The camera 70 outputs the captured image to the controller 9. FIG. 11 is a diagram schematically illustrating an example of a captured image generated in the capturing step. Note that hereinafter, the captured image generated in the monitoring processing may be referred to as a monitoring captured image. This monitoring captured image is an abbreviation for monitoring-captured-image data.

In the capturing step, the illuminator 71 emits illumination light in the first irradiation mode. As a specific example, the illuminator 71 provided at the first irradiation position adjacent to the camera 70 emits illumination light. Therefore, as illustrated in FIG. 11, the monitoring captured image includes the non-existent region IR11.

Next, the monitoring processing unit 92 monitors the positions of the chuck pins 26 on the basis of a region in the monitoring captured image except the non-existent region IR11 (step S22: a monitoring step). In the example in FIG. 11, a pin determination region R1 is illustrated in the captured image. The pin determination region R1 is a region used for monitoring the position of the chuck pin 26, and is preset. The pin determination region R1 is set to a region including at least part of the chuck pin 26. Here, the chuck pin 26 includes a support base 261, and a pin 262 erected on the upper surface of the support base 261. The support base 261 rotates to make the pin 262 come into contact with the periphery of the substrate W or to make the pin 262 separated from the periphery of the substrate W. That is, when the chuck pin 26 is located at the holding position, the pin 262 is in contact with the periphery of the substrate W. The pin determination region R1 is set in such a manner that the pin determination region R1 includes at least part of the pin 262 when the chuck pin 26 is located at the holding position.

In the example in FIG. 11, the pin determination region R1 includes the whole pin 262, part of the support base 261, and part of the non-existent region IR11. Furthermore, in the example in FIG. 11, only the pin determination region R1 for one of the chuck pins 26 is illustrated, but actually, pin determination regions R1 may be set for the four respective chuck pins 26. Hereinafter, for the sake of simplicity, the description will be given in which the pin determination region R1 in FIG. 11 is focused on.

Figure 12:
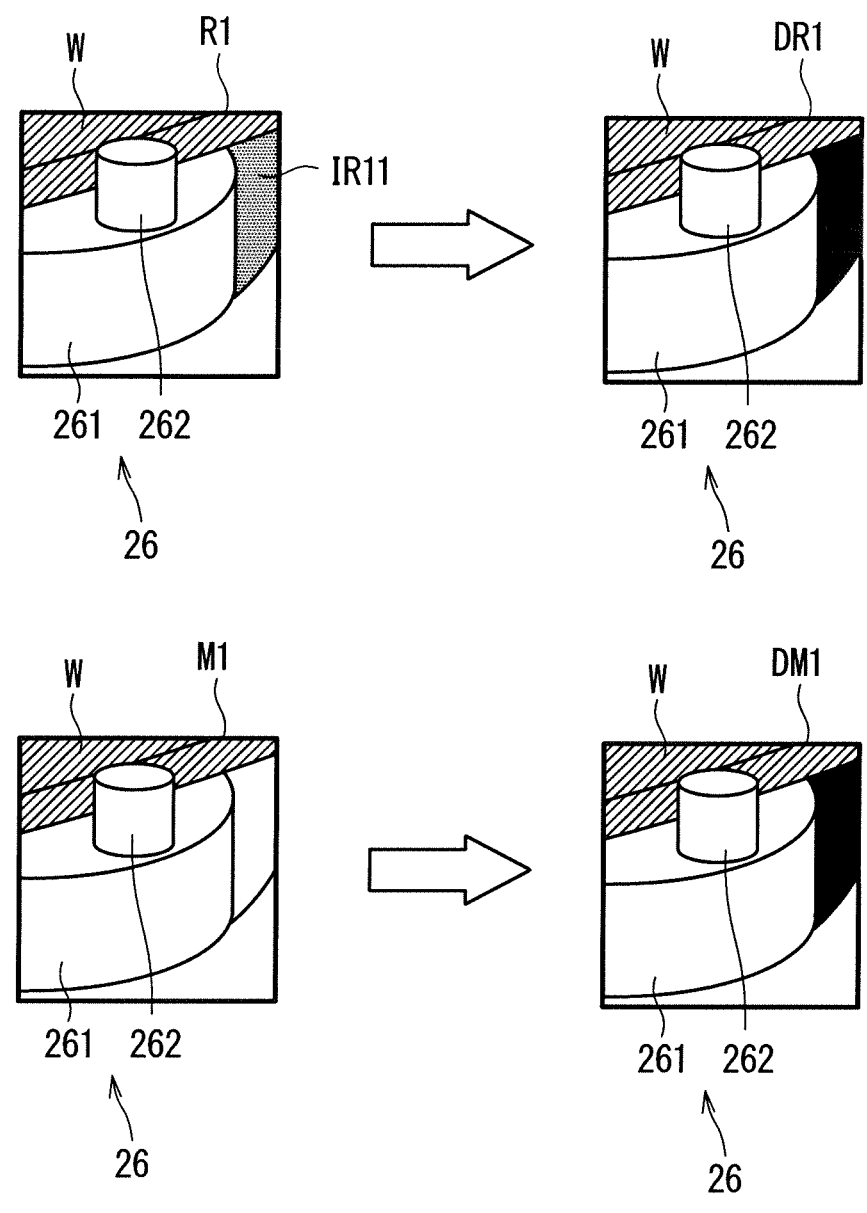
FIG. 12 is a diagram illustrating an example of a state in which a non-existent region is deleted from a monitoring captured image.

As illustrated in FIG. 11, part of the pin determination region R1 includes part of the non-existent region IR11. Here, the monitoring processing unit 92 monitors the position of the chuck pin 26 using a region in the monitoring captured image (more specifically, the pin determination region R1) except the non-existent region IR11. As a specific example, first, the monitoring processing unit 92 reads the non-existent-region data from the storage 94. Then, the monitoring processing unit 92 deletes, from the pin determination region R1, the non-existent region IR11 indicated in the non-existent-region data, to generate removed image data (hereinafter simply referred to as a removed image) DR1. FIG. 12 is a diagram illustrating an example of a state in which the non-existent region IR11 is deleted from the monitoring captured image. Here, since the position of the chuck pin 26 is monitored using the pin determination region R1, the pin determination region R1 is illustrated in FIG. 12. The monitoring processing unit 92 deletes the non-existent region IR11 in the pin determination region R1 to generate the removed image DR1. This deletion of the region includes setting the pixel value of each pixel in the region, to a specified value. For example, the monitoring processing unit 92 sets all pixel values of pixels belonging to the non-existent region IR11 in the pin determination region R1, to zero. In the example in FIG. 12, in the removed image DR1, the deleted region is illustrated in black.

In the present embodiment, the monitoring processing unit 92 also monitors the position of the chuck pin 26 using a reference image M1. The reference image M1 is an image in which the chuck pin 26 is normally located at the holding position. The reference image M1 is stored in the storage 94 in advance. The reference image M1 is generated, for example, on the basis of an image captured when the camera 70 captures the capture region in a state where the plurality of chuck pins 26 normally holds a substrate W. The reference image M1 is an image of the same region as the pin determination region R1.

In a case where the chuck pin 26 is normally located at the holding position, the degree of similarity between the pin determination region R1 and the reference image M1 is high. On the other hand, in a case where the chuck pin 26 is located at a position different from the holding position, the degree of similarity between the pin determination region R1 and the reference image M1 decreases. Conversely, in a case where the degree of similarity is high, it can be determined that the chuck pin 26 is normally located at the holding position, and in a case where the degree of similarity is low, it can be determined that a malfunction related to the chuck pin 26 has occurred.

However, in a case where the pin determination region R1 includes the non-existent region IR11, even if the chuck pin 26 is located at the holding position, the non-existent region IR11 may decrease the degree of similarity. Therefore, the precision of the position determination of the chuck pin 26 on the basis of the degree of similarity decreases. In other words, the monitoring precision decreases.

Accordingly, the monitoring processing unit 92 deletes the same region as the non-existent region IR11 from the reference image M1 to generate removed reference image data (hereinafter referred to as a removed reference image) DM1. Also in the removed reference image DM1, the pixel values of the pixels in the same region as the non-existent region IR11 are the specified value (for example, zero). In the example in FIG. 12, also in the removed reference image DM1, the deleted region is indicated in black.

The monitoring processing unit 92 monitors the position of the chuck pin 26 on the basis of the comparison between the removed image DR1 and the removed reference image DM1. As a specific example, first, the monitoring processing unit 92 calculates the degree of similarity between the removed image DR1 and the removed reference image DM1. The degree of similarity is not particularly limited, but may be, for example, a publicly known degree of similarity, such as a sum of squared differences of pixel values, a sum of absolute differences of pixel values, normalized cross-correlation, or zero-mean normalized cross-correlation. Since all the pixel values in the non-existent region IR11 are a specified value in both the removed image DR1 and the removed reference image DM1, the differences are zero. That is, the degree of similarity is calculated substantially in a region except the non-existent region IR11. In other words, the influence of the non-existent region IR11 can be avoided in the comparison between the removed image DR1 and the removed reference image DM1.

Next, the monitoring processing unit 92 compares the degree of similarity with a predetermined pin threshold. The pin threshold is preset, for example, by simulation or experiment, and is recorded in the storage 94. The monitoring processing unit 92 determines that the chuck pin 26 is normally located at the holding position when the degree of similarity is equal to or larger than the pin threshold, and determines that a malfunction related to the chuck pin 26 has occurred when the degree of similarity is smaller than the pin threshold. When it is determined that a malfunction has occurred in the chuck pin 26, the controller 9 may interrupt the processing on the substrate W, or may cause a notification unit (not illustrated), such as a display, to notify of the malfunction.

As described above, the monitoring processing unit 92 monitors the position of the chuck pin 26 without using the pixel values in the non-existent region IR11 in the monitoring captured image. Therefore, the monitoring processing unit 92 can avoid the influence of the non-existent region IR11 in the monitoring captured image to monitor the position of the chuck pin 26 with higher precision.

Furthermore, in the above-described example, in the setting-up processing step, the non-existent-region-identifying unit 91 identifies the non-existent region IR11 on the basis of a plurality of preliminarily captured images. Therefore, it is possible to identify a non-existent region with higher precision than a case where the user manually identifies the non-existent region by operating a user interface (not illustrated). Furthermore, the burden on the user can also be reduced.

Furthermore, in the above example, the plurality of different irradiation positions is adopted as the plurality of irradiation modes in the setting-up processing step. In this case, among the plurality of preliminarily captured images, the positions and shapes of a non-existent region indicating a shadow are different from each other. Therefore, the non-existent region IR11 is easily made more conspicuous in a difference image between the preliminarily captured images. That is, the difference between the pixel values of the non-existent region IR11 and the pixel values around the non-existent region IR11 can be made larger. Therefore, the non-existent-region-identifying unit 91 can identify the non-existent region IR11 with higher precision.

<Irradiation Mode: Wavelength>

The plurality of irradiation modes is not necessarily limited to different irradiation positions, and, for example, the wavelength spectra of the illumination light may be made different as the plurality of irradiation modes. In other words, the plurality of irradiation modes includes modes in which the capture region is irradiated with illumination light having different wavelength spectra. More specifically, in a preliminarily capturing step (step S1) of a setting-up processing step, the illuminator 71 may sequentially irradiate the capture region with illumination light with different wavelength spectra, and the camera 70 may capture the capture region each time. Here, for the sake of simplicity, it is assumed that only the illuminator 71 adjacent to the camera 70 emits illumination light.

The illuminator 71 may include a plurality of light sources that emits illumination light with different wavelength spectra. In this case, the illuminator 71 can vary the wavelength spectrum by switching between the light sources that emit illumination light. Alternatively, the illuminator 71 may include a single light source capable of varying the wavelength.

The illumination light emitted by the illuminator 71 is reflected by an object (the existent) in the capture region, and the reflected light enters the light receiving surface of the camera 70. Since the reflected light from the existent, such as the chuck pins 26, depends on the wavelength spectrum, the intensity of the reflected light from the existent differs depending on the wavelength of the illumination light. Therefore, in a plurality of preliminarily captured images corresponding to different wavelength spectra, existent regions indicating the existent are different from each other. As a specific example, in a state where the capture region is irradiated with illumination light in a blue wavelength band, blue is the main component in an existent region of a preliminarily captured image. On the other hand, in a state where the capture region is irradiated with illumination light in a red wavelength band, red is the main component in the existent region of a preliminarily captured image. That is, the pixel values in the existent regions are different between both the preliminarily captured images.

On the other hand, a shadow hardly depends on the wavelength spectrum of the illumination light. This is because a shadow is a region where reflected light hardly occurs. Therefore, in a plurality of preliminarily captured images, the non-existent regions IR11 indicating shadows ideally coincide with each other. As a specific example, the non-existent regions IR11 are black in both the state where the capture region is irradiated with the illumination light in a blue wavelength band, and the state where the capture region is irradiated with the illumination light in a red wavelength band. That is, the pixel values of the non-existent regions IR11 in both the preliminarily captured images are substantially zero.

Therefore, the non-existent-region-identifying unit 91 can identify the non-existent region IR11 on the basis of the difference between the plurality of preliminarily captured images. For example, in a preliminarily identifying step (step S12), the non-existent-region-identifying unit 91 generates a difference image between a preliminarily captured image corresponding to red illumination light and a preliminarily captured image corresponding to blue illumination light. In the difference image, a pixel value of each pixel in the non-existent region IR11 is substantially zero, and a pixel value of each pixel in an existent region has a value different from zero. Therefore, the non-existent-region-identifying unit 91 determines, for each pixel, whether or not the absolute value of the pixel value is equal to or smaller than a predetermined threshold in the difference image, and identifies a pixel group having the absolute values equal to or smaller than the threshold, as the non-existent region IR11.

Note that if the camera 70 is a color camera, the difference in the existent region is conspicuous, but the camera 70 may be a grayscale camera. Even in this case, since the reflectance of the existent differs for each wavelength, the existent regions corresponding to different wavelength spectra are different from each other.

In accordance with this, since it is not necessary to emit illumination light from a plurality of irradiation positions, it is not necessary to provide a plurality of the illuminators 71, or it is not necessary to move the illuminator 71.

<Irradiation Mode: Quantity of Light>

As the plurality of irradiation modes, the quantity of light of illumination light may be made different. In other words, the plurality of irradiation modes includes modes in which the capture region is irradiated with illumination light having different quantities of light. More specifically, in a preliminarily capturing step (step S11), the illuminator 71 may sequentially irradiate the capture region with illumination light having different quantities of light, and the camera 70 may capture the capture region each time. In this case, the illuminator 71 includes a light source that emits illumination light with a variable quantity of light.

The camera 70 receives the reflected light reflected by the existent, and the quantity of light of the reflected light from the existent, such as the chuck pins 26, depends on the quantity of light of the illumination light. On the other hand, a shadow hardly depends on the quantity of light. Therefore, in a plurality of preliminarily captured images corresponding to different quantities of light, existent regions indicating the existent (in particular, luminance) are different from each other. As a specific example, in a state where the capture region is irradiated with illumination light with a larger quantity of light, the pixel values in an existent region in the preliminarily captured image have relatively large values. On the other hand, in a state where the capture region is irradiated with illumination light with a smaller quantity of light, the pixel values of the existent region have relatively small values. That is, the pixel values in the existent regions are different between both the preliminarily captured images.

On the other hand, a shadow hardly depends on the quantity of light of the illumination light. This is because a shadow is a region where reflected light hardly occurs. Therefore, in a plurality of preliminarily captured images, the non-existent regions IR11 indicating shadows ideally coincide with each other. As a specific example, the non-existent regions IR11 are black in both the state where the capture region is irradiated with the illumination light with a large quantity of light, and the state where the capture region is irradiated with the illumination light with a small quantity of light. That is, the pixel values of the non-existent regions IR11 in both the preliminarily captured images are substantially zero.

Therefore, the non-existent-region-identifying unit 91 can identify the non-existent region IR11 on the basis of the difference between the plurality of preliminarily captured images. For example, in a preliminarily identifying step (step S12), the non-existent-region-identifying unit 91 generates a difference image between a preliminarily captured image corresponding to a large quantity of light and a preliminarily captured image corresponding to a small quantity of light. In the difference image, a pixel value of each pixel in the non-existent region IR11 is substantially zero, and a pixel value of each pixel in an existent region has a value different from zero. Therefore, the non-existent-region-identifying unit 91 determines, for each pixel, whether or not the absolute value of the pixel value is equal to or smaller than a predetermined threshold in the difference image, and identifies a pixel group having the absolute values equal to or smaller than the threshold, as the non-existent region IR11.

In accordance with this, since it is not necessary to emit illumination light from a plurality of irradiation positions, it is not necessary to provide a plurality of the illuminators 71, or it is not necessary to move the illuminator 71. Furthermore, in general, the quantity of light of the light source can be adjusted by adjusting the power supplied to the light source. That is, a special light source is not necessary as the illuminator 71, and an inexpensive light source can be adopted.

<Non-Existent Region: Shadow of Object Except Monitoring Target Object>

In the above examples, the description has been given using the non-existent region IR11 indicating a shadow of the chuck pin 26 itself, which is an example of the monitoring target object. However, a shadow of an object different from the monitoring target object may be formed around the monitoring target object. For example, a shadow of any one of the first nozzle 30, the second nozzle 60, the third nozzle 65, and the nozzle arms 32, 62, and 67 may be formed around the chuck pin 26. As a specific example, the second nozzle 60 may stop at a bevel processing position facing the peripheral portion of a substrate W in the vertical direction. In the example in FIG. 2, the second nozzle 60 and the nozzle arm 62 that stop at the bevel processing position are indicated by imaginary lines. In this case, a shadow of the second nozzle 60 or the nozzle arm 62 may be generated in the vicinity of the chuck pin 26 on the right side. Therefore, even in a captured image generated by the camera 70 capturing the capture region, a non-existent region indicating a shadow is included in the vicinity of the chuck pin 26. Even in a case where such a shadow is included in a pin determination region R1 of the captured image, the monitoring precision of the chuck pin 26 may decrease.

Therefore, in a setting-up processing step, the non-existent-region-identifying unit 91 may identify such a non-existent region indicating a shadow of another object. As a specific example, in a preliminarily capturing step (step S11), in a state where the second nozzle 60 is located at the bevel processing position, the camera 70 captures the capture region in each of the plurality of irradiation modes including the first irradiation mode to generate a plurality of preliminarily captured images.

Next, in a preliminarily identifying step (step S12), the non-existent-region-identifying unit 91 identifies a non-existent region indicating a shadow in the preliminarily captured image corresponding to the first irradiation mode on the basis of the plurality of preliminarily captured images. Through this step, a non-existent region indicating a shadow of an object different from a monitoring target object is also identified. Then, in a storage step (step S13), the non-existent-region-identifying unit 91 stores non-existent-region data indicating the identified non-existent region in the storage 94.

In a capturing step (step S21) of monitoring processing, in a state where the illuminator 71 irradiates the capture region with the illumination light in the first irradiation mode, the camera 70 captures the capture region to generate a monitoring captured image. In a following monitoring step (step S22), the monitoring processing unit 92 identifies a non-existent region on the basis of the non-existent-region data stored in the storage 94, and monitors the state of the monitoring target object on the basis of a region of the monitoring captured image except the non-existent region. That is, the monitoring processing unit 92 monitors the state of the monitoring target object without using the non-existent region.

In accordance with this, even if a shadow of an object different from the monitoring target object is formed around the monitoring target object, the influence of the shadow can be suppressed to monitor the state of the monitoring target object with higher precision.

Furthermore, in a case where an object different from the monitoring target object is a movable object, such as the second nozzle 60, the position and shape of the shadow may change correspondingly to the position of the movable object. In this case, in a setting-up processing step, a non-existent region may be identified correspondingly to the position of the movable object, and non-existent-region data corresponding to the position of the movable object may be stored in the storage 94. Then, in a capturing processing, the non-existent-region data corresponding to the position of the movable object may be read from the storage 94, and the monitoring target object may be monitored without using a non-existent region indicated by the non-existent-region data.

<Non-Existent Region: Reflected Image>

Figure 13:
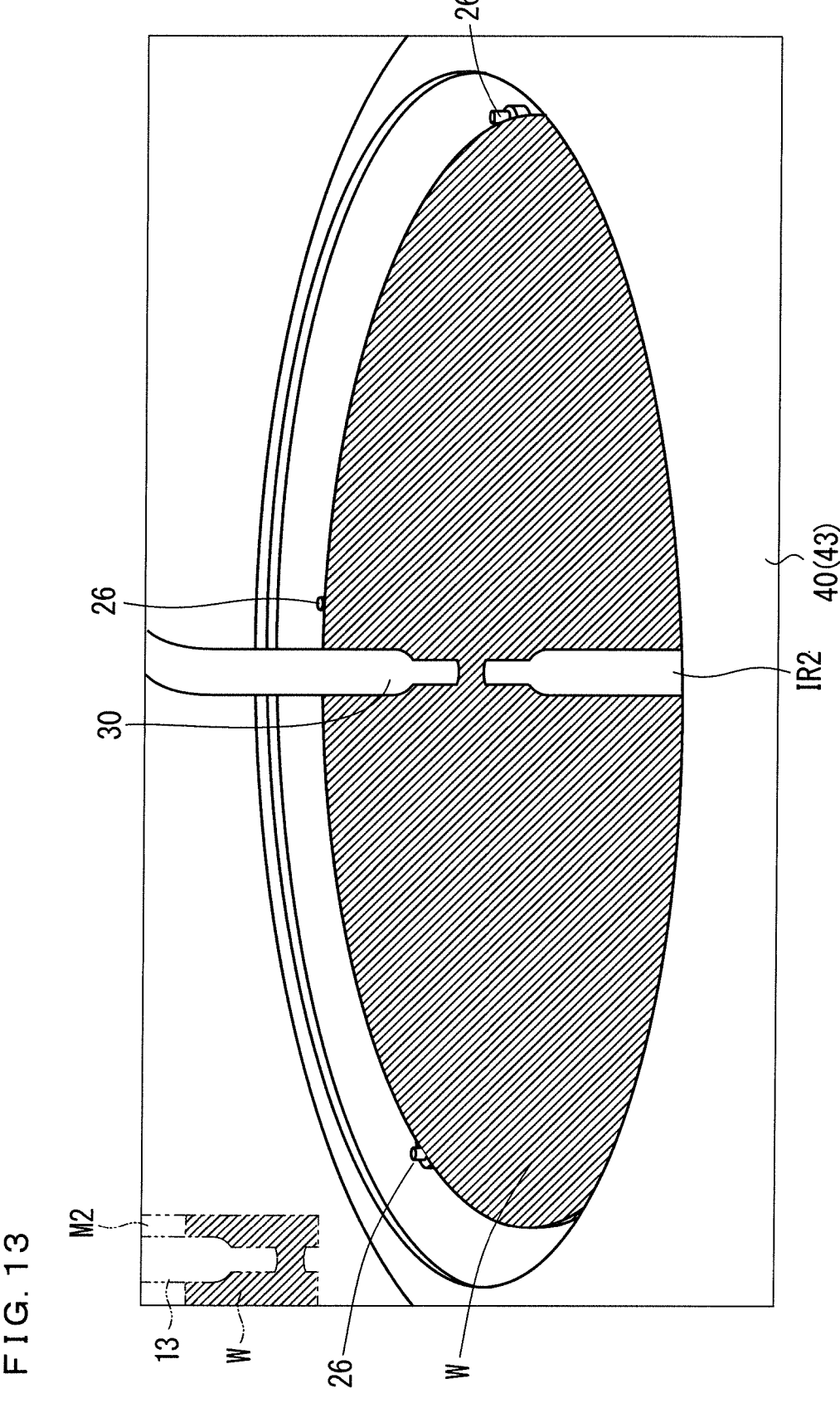

FIG. 13 is a diagram schematically illustrating an example of a captured image. In the captured image in FIG. 13, the first nozzle 30 is located at a nozzle processing position, and a reflected image of the first nozzle 30 appears on the upper surface of a substrate W. Such a reflected image does not exist as the existent on the upper surface of the substrate W, and may be a factor in the decrease in the monitoring precision, similarly to a shadow.

Therefore, the controller 9 preliminarily identifies a non-existent region IR2 indicating a reflected image in a captured image, and monitors the state of a monitoring target object on the basis of a region except the non-existent region IR2. That is, the controller 9 monitors the state of the monitoring target object without using the non-existent region IR2.

<Setting-Up Processing Step>

An example of a setting-up processing step is similar to that in FIG. 7. That is, in a preliminarily capturing step (step S11), the capture region is sequentially irradiated with illumination light in the plurality of irradiation modes, and the camera 70 captures the capture region in each of the irradiation modes. For example, when the illumination light is emitted with a small quantity of light, the luminance of both the first nozzle 30 and the reflected image is small, and when the illumination light is emitted with a large quantity of light, the luminance of both the first nozzle 30 and the reflected image is large. The luminance of the first nozzle 30 depends on the reflectance of the first nozzle 30, whereas the luminance of the reflected image depends on not only the reflectance of the first nozzle 30 but also the reflectance of the upper surface of the substrate W. Therefore, the amount of variation in luminance is different between the first nozzle 30 and the reflected image. Therefore, the non-existent-region-identifying unit 91 can identify the non-existent region IR2 on the basis of the difference between a preliminarily captured image obtained under illumination light with a large quantity of light and a preliminarily captured image obtained under illumination light with a small quantity of light. For example, in a preliminarily identifying step (step S12), the non-existent-region-identifying unit 91 may generate a difference image between both the preliminarily captured images, and identify a pixel group having pixel values within a predetermined range in the difference image, as the non-existent region IR12. Then, in a storage step (step S13), the non-existent-region-identifying unit 91 stores non-existent-region data in the storage 94.

<Monitoring Processing: Position of Nozzle>

Next, an example of monitoring processing will be described. Here, a case where the position of the first nozzle 30 is monitored will be described. If the first nozzle 30 can appropriately move to the nozzle processing position, the processing liquid can be supplied, at an appropriate position, to a substrate W. However, if the first nozzle 30 cannot move to the nozzle processing position, a defect may occur in the processing on the substrate W. Therefore, the position of the first nozzle 30 is monitored.

An example of the monitoring processing is similar to that in FIG. 10. That is, in a capturing step (step S21), the camera 70 captures the capture region. As a more specific example, in a liquid processing step (step S3), the capturing step is performed after the controller 9 gives a control signal to an arm driving motor. If the arm driving motor can move the first nozzle 30 to the nozzle processing position, the first nozzle 30 is located at the nozzle processing position in a monitoring captured image.

Next, in a monitoring step (step S22), the monitoring processing unit 92 reads a reference image M2 from the storage 94. As illustrated in FIG. 13, the reference image M2 is an image having a size smaller than the size of the captured image. The reference image M2 includes the distal end portion of the first nozzle 30. Such a reference image M2 is obtained as follows, for example. That is, in a state where the first nozzle 30 is located at the nozzle processing position, the camera 70 captures the capture region to generate a captured image. Then, the controller 9 cuts out a partial region including the distal end portion of the first nozzle 30 from this captured image to generate the reference image M2. In the present embodiment, the controller 9 generates the reference image M2 that does not include a reflected image of the first nozzle 30. Specifically, since the controller 9 can grasp the position and shape of the non-existent region IR2 on the basis of the non-existent-region data stored in the storage 94, the controller 9 sets the reference image M2 in which the non-existent region IR2 is avoided. In the example in FIG. 13, the lower side of the reference image M2 has a recess in the same shape as the upper contour of the non-existent region IR2. Note that it is sufficient that the reference image M2 does not include the non-existent region IR2, and the lower side of the reference image M2 does not necessarily have a recess shape.

Next, the monitoring processing unit 92 monitors the position of the first nozzle 30 by comparing a monitoring captured image from the camera 70 with the reference image M2. More specifically, first, the monitoring processing unit 92 detects the position of the first nozzle 30 by matching processing between a monitoring captured image and the reference image M2. The matching processing includes, for example, template matching. As a specific example, the monitoring processing unit 92 scans the reference image M2 in the monitoring captured image, and detects a position where the degree of similarity between the reference image M2 and each partial region in the monitoring captured image is the highest, as the position of the first nozzle 30. The degree of similarity is not particularly limited, but may be, for example, a publicly known degree of similarity, such as a sum of squared differences of pixel values, a sum of absolute differences of pixel values, normalized cross-correlation, or zero-mean normalized cross-correlation.

The monitoring processing unit 92 may determine whether or not the difference between the position of the detected first nozzle 30 and a target position (that is, a normal nozzle processing position) is equal to or smaller than a predetermined position threshold. The position threshold is preset, for example, by simulation or experiment, and is stored in the storage 94. The monitoring processing unit 92 may determine that the position of the first nozzle 30 is normal when the difference is equal to or smaller than the position threshold, and may determine that a malfunction related to the position of the first nozzle 30 has occurred when the difference is larger than the position threshold.

As described above, the monitoring processing unit 92 monitors the position of the first nozzle 30 on the basis of the comparison between the monitoring captured image and the reference image M2 not including the non-existent region IR2. Therefore, the monitoring processing unit 92 can avoid the influence of the non-existent region IR2 to monitor the position of the first nozzle 30 with higher precision.

<Monitoring Processing: Discharge State of Nozzle>

FIG. 14 is a diagram schematically illustrating an example of a captured image. In the captured image in FIG. 14, the first nozzle 30 discharges a liquid-column-shaped processing liquid, and a reflected image of an object different from the first nozzle 30 appears on the upper surface of a substrate W. In FIG. 14, a non-existent region IR3 indicating this reflected image is schematically indicated by an ellipse. Such a reflected image does not exist as the existent on the upper surface of the substrate W, and may be a factor in the decrease in the monitoring precision, similarly to a shadow.

Therefore, the controller 9 preliminarily identifies the non-existent region IR3 indicating the reflected image in the captured image, and monitors the state of a monitoring target object on the basis of a region except the non-existent region IR3. That is, the controller 9 monitors the state of the monitoring target object without using the non-existent region IR3.

<Setting-Up Processing Step>

An example of a setting-up processing step is similar to the setting-up processing step in the position monitoring of the first nozzle 30. Through this setting-up processing step, non-existent-region data indicating the non-existent region IR3 is stored in the storage 94.

<Monitoring Processing: Discharge State of Nozzle>

Next, an example of monitoring processing will be described. Here, a case where the discharge state of the first nozzle 30 is monitored will be described. If the discharge and stop of the processing liquid from the first nozzle 30 can be switched at an appropriate timing, the first nozzle 30 can supply the processing liquid to a substrate W for an appropriate discharge time. On the other hand, if the discharge and stop of the processing liquid cannot be switched at an appropriate timing, the first nozzle 30 cannot supply the processing liquid to a substrate W for an appropriate discharge time, and a defect may occur in the processing on the substrate W. Therefore, the discharge state of the first nozzle 30 is monitored, and a discharge start timing at which a discharge stop is switched to a discharge, and a discharge stop timing at which a discharge is switched to a discharge stop are identified. Thus, a discharge time from the discharge start timing to the discharge stop timing can be obtained.

An example of the monitoring processing is similar to that in FIG. 10. That is, in a capturing step (step S21), the camera 70 captures the capture region. As a more specific example, in a liquid processing step (step S3), the capturing step is repeatedly performed from a timing before the controller 9 outputs an opening signal to the valve 35 to a timing after the controller 9 outputs a closing signal to the valve 35.

In the example in FIG. 14, a discharge determination region R3 is set in a monitoring captured image. The discharge determination region R3 is set in such a manner that the discharge determination region R3 includes the liquid-column-shaped processing liquid discharged from the first nozzle 30. As a specific example, the upper side of the discharge determination region R3 is set below the lower end of the first nozzle 30, and the lower side of the discharge determination region R3 is set above the position where the liquid-column-shaped processing liquid has landed on the upper surface of the substrate W. Furthermore, the width of the discharge determination region R3 in a lateral direction is set wider than the width of the liquid-column-shaped processing liquid. In the example in FIG. 14, part of the non-existent region IR3 is included in the discharge determination region R3.

In a monitoring step (step S22), the monitoring processing unit 92 monitors the discharge state of the first nozzle 30 on the basis of a region obtained by deleting the non-existent region IR3 from the discharge determination region R3 of the monitoring captured image (that is, a removed image). For example, the monitoring processing unit 92 determines whether or not the sum of the pixel values of the removed image is within a predetermined range. The predetermined range is, for example, a range of a value of the sum of the pixel values of the removed image in a state where a liquid-column-shaped processing liquid is discharged from the first nozzle 30, and is preset by simulation or experiment. When the sum of the pixel values of the removed image is within the predetermined range, the monitoring processing unit 92 determines that the processing liquid is discharged from the first nozzle 30, and when the sum is out of the predetermined range, the monitoring processing unit 92 determines that the discharge of the processing liquid from the first nozzle 30 is stopped.

As described above, the monitoring processing unit 92 monitors the discharge state of the first nozzle 30 on the basis of a region of the discharge determination region R3 except the non-existent region IR3. Therefore, the monitoring processing unit 92 can avoid the influence of the non-existent region IR3 to monitor the discharge state of the first nozzle 30 with higher precision.

The camera 70 repeatedly captures the capture region (a monitoring step), and the monitoring processing unit 92 determines the discharge state each time (a monitoring step). The monitoring processing unit 92 identifies a discharge start timing at which the discharge state is switched from a discharge stop to a discharge, and a discharge stop timing at which the discharge state is switched from a discharge to a discharge stop, and obtains a discharge time from the discharge start timing to the discharge stop timing. The monitoring processing unit 92 determines whether the difference between the discharge time and a target discharge time is equal to or smaller than a predetermined time threshold. The time threshold is preset, for example, by simulation or experiment, and is stored in the storage 94. The monitoring processing unit 92 determines that the discharge time is normal when this difference is equal to or smaller than the time threshold, and determines that a malfunction related to the discharge of the first nozzle 30 has occurred when this difference is larger than the time threshold.

As described above, the monitoring methods in the substrate processing apparatus 100 and the substrate processing apparatus 100 have been described in detail, but the above description is illustrative in all aspects, and these are not limited thereto. It is understood that numerous modifications not illustrated can be assumed without departing from the scope of the present disclosure. The configurations described in the above embodiments and modifications can be appropriately combined or omitted as long as they do not contradict each other.

For example, although in the above-described example, the controller 9 identifies a non-existent region, the user may input non-existent-region data indicating a non-existent region to the controller 9 using a user interface (not illustrated), and the controller 9 may store the non-existent-region data in the storage 94.

While the invention has been shown and described in detail, the foregoing description is in all aspects illustrative and not restrictive. It is therefore understood that numerous modifications and variations can be devised without departing from the scope of the invention.

What is claimed is:

1. A monitoring method in a substrate processing apparatus, the method comprising:
setting-up processing including
sequentially capturing, with a camera, a capture region including a monitoring target object in a chamber containing a substrate holder holding a substrate while an illuminator sequentially irradiates said capture region with illumination light in a plurality of irradiation modes, to generate a plurality of pieces of preliminarily captured image data corresponding to said plurality of irradiation modes by said camera, said plurality of irradiation modes including a first irradiation mode and a second irradiation mode different from said first irradiation mode, said plurality of preliminarily captured image data including a first preliminarily captured image data and a second preliminarily captured image data, said first preliminarily captured image data generated by capturing said capture region with said camera while said capture region is irradiated with said first irradiation mode, said second preliminarily captured image data generated by capturing said capture region with said camera while said capture region is irradiated with said second irradiation mode,
identifying a non-existent region based on a difference between said plurality of pieces of preliminarily captured image data by a non-existent region identifier of a controller, said non-existent region indicating at least one of a shadow and a reflected image of an object included in said first preliminarily captured image data at a time of irradiation with said illumination light in said first irradiation mode, said difference including a difference between said first preliminarily captured image data and said second preliminarily captured image data, and
storing, in a storage, non-existent-region data indicating a position and a shape of said non-existent region by said controller;
after said setting-up processing, capturing said capture region with said camera while said illuminator irradiates said capture region with said illumination light in said first irradiation mode, to generate monitoring-captured-image data; and
monitoring said monitoring target object based on a region of said monitoring-captured-image data except said non-existent region indicated by said non-existent-region data stored in said storage by a monitoring processor of said controller.

2. The monitoring method in the substrate processing apparatus according to claim 1, wherein
said storage stores reference image data including said monitoring target object that is normal, and
in said monitoring, said monitoring target object is monitored based on comparison between removed image data obtained by deleting said non-existent region from said monitoring-captured-image data, and removed reference image data obtained by deleting a region same as said non-existent region from said reference image data.

3. A monitoring method in a substrate processing apparatus, the method comprising:
setting-up processing including
sequentially capturing, with a camera, a capture region including a monitoring target object in a chamber containing a substrate holder holding a substrate an illuminator sequentially irradiates said capture region with illumination light in a plurality of irradiation modes, to generate a plurality of pieces of preliminarily captured image data corresponding to said plurality of irradiation modes by said camera, said plurality of irradiation modes including a first irradiation mode and a second irradiation mode different from said first irradiation mode, said plurality of preliminarily captured image data including a first preliminarily captured image data and a second preliminarily captured image data, said first preliminarily captured image data generated by capturing said capture region with said camera while said capture region is irradiated with said first irradiation mode, said second preliminarily captured image data generated by capturing said capture region with said camera while said capture region is irradiated with said second irradiation mode, identifying a non-existent region based on a difference between said plurality of pieces of preliminarily captured image data by a non-existent region identifier of a controller, said non-existent region indicating at least one of a shadow and a reflected image of an object included in said first preliminarily captured image data at a time of irradiation with said illumination light in a first irradiation mode, said difference including a difference between said first preliminarily captured image data and said second preliminarily captured image data, and storing, in a storage, non-existent-region data indicating a position and a shape of said non-existent region by said controller;

after said setting-up processing, capturing said capture region while said illuminator irradiates said capture region with said illumination light in said first irradiation mode, to generate monitoring-captured-image data; and monitoring said monitoring target object based on comparison between said monitoring-captured-image data and reference image data including said monitoring target object that is normal and not including a region same as said non-existent region indicated by said non-existent-region data stored in said storage by a monitoring processor of said controller.

4. The monitoring method in the substrate processing apparatus according to claim 1, wherein
   said plurality of irradiation modes includes modes in which said capture region is irradiated with said illumination light from different irradiation positions.

5. The monitoring method in the substrate processing apparatus according to claim 3, wherein said plurality of irradiation modes includes modes in which said capture region is irradiated with said illumination light from different irradiation positions.

6. The monitoring method in the substrate processing apparatus according to claim 1, wherein
   said plurality of irradiation modes includes modes in which said capture region is irradiated with said illumination light having different wavelength spectra.

7. The monitoring method in the substrate processing apparatus according to claim 3, wherein
   said plurality of irradiation modes includes modes in which said capture region is irradiated with said illumination light having different wavelength spectra.

8. The monitoring method in the substrate processing apparatus according to claim 1, wherein
   said plurality of irradiation modes includes modes in which said capture region is irradiated with said illumination light having different quantities of light.

9. The monitoring method in the substrate processing apparatus according to claim 3, wherein
   said plurality of irradiation modes includes modes in which said capture region is irradiated with said illumination light having different quantities of light.

10. The monitoring method in the substrate processing apparatus according to claim 1, wherein
    in said preliminarily identifying, said non-existent region is identified based on a difference between said first preliminarily captured image data corresponding to said first irradiation mode and average image data of said plurality of pieces of preliminarily captured image data.

11. The monitoring method in the substrate processing apparatus according to claim 3, wherein
    in said preliminarily identifying, said non-existent region is identified based on a difference between said first preliminarily captured image data corresponding to said first irradiation mode and average image data of said plurality of pieces of preliminarily captured image data.

* * * * *